(12) United States Patent
Sonoda et al.

(10) Patent No.: US 7,666,692 B2
(45) Date of Patent: Feb. 23, 2010

(54) SEMICONDUCTOR DEVICE, ITS MANUFACTURE METHOD AND ELECTRONIC COMPONENT UNIT

(75) Inventors: Junichi Sonoda, Tokyo (JP); Seiichiro Kobayashi, Tokyo (JP); Kazuyuki Yoshimizu, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 42 days.

(21) Appl. No.: 12/146,236

(22) Filed: Jun. 25, 2008

(65) Prior Publication Data

US 2008/0268616 A1    Oct. 30, 2008

Related U.S. Application Data

(62) Division of application No. 11/204,527, filed on Aug. 16, 2005, now Pat. No. 7,429,754.

(30) Foreign Application Priority Data

Sep. 14, 2004    (JP) ............................. 2004-267159

(51) Int. Cl.
*H01L 21/00* (2006.01)
(52) U.S. Cl. .................. 438/22; 438/29; 257/E33.001
(58) Field of Classification Search .................. 438/22, 438/24, 27, 29, 48; 257/E33.001
See application file for complete search history.

(56) References Cited

U.S. PATENT DOCUMENTS

| 5,917,202 A | 6/1999 | Haitz et al. |
| 6,797,987 B2 | 9/2004 | Chen |
| 6,800,500 B2 * | 10/2004 | Coman et al. ................. 438/22 |

FOREIGN PATENT DOCUMENTS

| JP | 5-251739 A | 9/1993 |
| JP | 2001-044491 A | 2/2001 |
| JP | 2001-189490 A | 7/2001 |
| JP | 2002-217450 A | 8/2002 |

* cited by examiner

*Primary Examiner*—Hoai v Pham
(74) *Attorney, Agent, or Firm*—Frishauf, Holtz, Goodman & Chick, P.C.

(57) ABSTRACT

A LED chip having first and second electrodes on opposite principal surfaces, is bonded to a substrate through a composite bonding layer. The composite bonding layer is formed when a support substrate including the substrate and a first bonding layer is bonded to a lamination structure including the LED, the first electrode and a second bonding layer. The first or second bonding layer contains at least part of eutectic composition. At least one of the support substrate and the lamination structure includes a diffusion material layer. The composite bonding layer is formed in such a manner that eutectic material contents are mixed with the other to form a first mixture, and that the first mixture is mixed with diffusion material to form a second mixture having a melting point higher than a melting point of the first mixture.

7 Claims, 22 Drawing Sheets

SEMICONDUCTOR DEVICE, ITS MANUFACTURE METHOD AND ELECTRONIC COMPONENT UNIT

CROSS REFERENCE TO RELATED APPLICATION

The present application is a Divisional Application of U.S. application Ser. No. 11/204,527 filed Aug. 16, 2005, now U.S. Pat. No. 7,429,754, which is based on and claims priority of Japanese Patent Application No. 2004-267159 filed on Sep. 14, 2004, the entire contents of which are incorporated herein by reference.

BACKGROUND OF THE INVENTION

A) Field of the Invention

The present invention relates to a semiconductor device, its manufacture method and an electronic component unit.

B) Description of the Related Art

Semiconductor light emitting devices have been proposed which have the structure that a semiconductor light emitting layer is bonded to a conductive substrate (for example, refer to Japanese Patent Laid-open Publication No. 2001-189490, No. 2001-44491, No. 2002-217450, No. HEI-5-251739, and U.S. Pat. No. 5,917,202, which are incorporated herein by reference).

FIG. 19 is a schematic cross sectional view showing an example of a conventional semiconductor light emitting device 61 having the structure that a semiconductor light emitting layer is bonded to a conductive substrate. A reflection layer 68 made of metal is stacked on a conductive support substrate 63, e.g., a Si substrate heavily doped with n-type impurities. Epitaxially grown on this reflection layer 68 are an n-type clad layer 66 having a potential barrier function of holes, an active layer 65 for emitting light upon recombination of holes and electrons and a p-type clad layer 64 having a potential barrier function of electrons, in this order from the bottom. On the p-type clad layer 64, a p-side ohmic electrode 62 is formed. An n-side optical output electrode 67 is formed on the conductive support substrate 63 on the side opposite to the reflection layer 68.

Light generated in the active layer 65 and became incident upon the reflection layer 68 before reaching the conductive support substrate 63 is reflected by the reflection layer 68 and output from the semiconductor light emitting device 61. If the reflection layer 68 is made by reducing an angle dependency of a reflectivity, an optical output efficiency can be improved.

FIG. 20A to 20D are schematic diagrams illustrating a manufacture method for the semiconductor light emitting device 61 shown in FIG. 19.

Reference is made to FIG. 20A. A reflection layer 68 is formed on a conductive support substrate 63 to form a first substrate 70.

Reference is made to FIG. 20B. On a temporary substrate (growth substrate) 69 made of, e.g., GaAs, a p-type clad layer 64, an active layer 65 and an n-type clad layer 66 are epitaxially grown in this order from the bottom, to form a second substrate 71.

Reference is made to FIG. 20C. The first substrate 70 shown in FIG. 20A is bonded to the second substrate 71 shown in FIG. 20B, with the metal layer 68 being adhered to the n-type clad layer 66.

Reference is made to FIG. 20D. After the temporary substrate 69 is removed, a p-side ohmic electrode 62 is formed on the p-type clad layer 64, and an n-side optical output electrode 67 is formed on the conductive support substrate 63 on the side opposite to the reflection layer 68.

In a device having the bonding structure, ohmic electrodes are formed after a bonding process. Since the device is heated to a higher temperature (about 400° C. to 500° C.) than a bonding temperature in order to form ohmic contacts, a bonding layer made of bonding eutectic material or solder is again heated and melted so that peeling (include "floating" not complete peeling) may occur. The peeling becomes the reason of lowering reliability.

The reflection layer 68 has an ohmic contact with the n-type clad layer 66, providing an n-side electrode function. There is a severe trade-off between good reflection characteristics and good ohmic contact. In order to form an ohmic contact, an alloying process is necessary. However, during alloying, electrode material diffuses and a reflectivity is lowered.

Solder or eutectic material (not shown) is used to adhere (bond) the first substrate 70 and second substrate 71. If solder or eutectic material enters the reflection layer, the reflection characteristics of the reflection layer are degraded. In addition to this problem, there is another problem of ball-up of solder or eutectic material on the substrate 70 if the substrate 70 is larger than the substrate 71, when the two substrates 70 and 71 are bonded together.

U.S. Pat. No. 5,917,202 proposes the structure of a semiconductor light emitting device in which a barrier layer and a solder bonding layer are disposed between a reflection layer and a solder layer. The barrier layer is made of tungsten (W) or molybdenum (Mo) and prevents element diffusion, and the solder bonding layer is made of nickel (Ni) and improves tight adhesion.

SUMMARY OF THE INVENTION

An object of this invention is to provide a high quality semiconductor device, its manufacture method and an electronic component unit.

According to one aspect of the present invention, there is provided a manufacture method for a semiconductor device comprising steps of: (a) preparing a first substrate; (b) forming a first bonding layer above the first substrate to form a support substrate; (c) preparing a second substrate; (d) forming a semiconductor layer on the second substrate; (e) forming a second bonding layer above the semiconductor layer to form a semiconductor lamination structure; (f) forming a diffusion material layer containing diffusion material by at least one of a step (f1) of forming the diffusion material layer above the first substrate and forming the first bonding layer above the diffusion material layer, respectively at the step (b) and a step (f2) of forming the diffusion material layer above the semiconductor material layer and forming the second bonding layer above the diffusion material layer, respectively at the step (e); and (g) bonding the first bonding layer of the support substrate and the second bonding layer of the semiconductor lamination structure to form a bonding body, the step (g) including a step (g1) of forming a first mixture body by mixing said first and second bonding layers, the first or second bonding layer containing eutectic material and a step (g2) of forming a second mixture body by mixing the first mixture body and the diffusion material of the diffusion material layer, the second mixture body having a melting point higher than a melting point of the first mixture body.

According to the manufacture method for a semiconductor device, a high quality semiconductor device can be manufactured having an improved tight adhesion during a heating process after bonding.

According to another aspect of the present invention, there is provided a semiconductor device comprising: a substrate; a composite bonding layer formed above the substrate; a first electrode formed above the composite bonding layer; a semiconductor layer formed in an area including a surface of the first electrode; and a second electrode formed in a partial surface area of the semiconductor layer, wherein: the composite bonding layer is formed when a support substrate including the substrate and a first bonding layer is bonded to a semiconductor lamination structure including the semiconductor layer, the first electrode and a second bonding layer; the first or second bonding layer contains eutectic material contents; at least one of the support substrate and the semiconductor lamination structure includes a diffusion material layer containing diffusion material; and the composite bonding layer is formed in such a manner that eutectic material contents contained in one of the first and second bonding layers are mixed with the other to form a first mixture body, and that the first mixture body is mixed with diffusion material contained in the diffusion material layer to form a second mixture body having a melting point higher than a melting point of the first mixture body.

This semiconductor device has good ohmic contact, can prevent ball-up and electrode function deterioration, and has an improved tight adhesion during a heating process after bonding.

According to another aspect of the present invention, there is provided an electronic component unit comprising: a base; a composite bonding layer formed above the substrate; and an electronic component formed above the composite bonding layer, wherein: the composite bonding layer is formed when a base member including the base and a first bonding layer is bonded to an electronic component member including the electronic component and a second bonding layer; the first or second bonding layer contains eutectic material contents; at least one of the base member and the electronic component member includes a diffusion material layer containing diffusion material; and the composite bonding layer is formed in such a manner that eutectic material contents contained in one of the first and second bonding layers are mixed with the other to form a first mixture body, and that the first mixture body is mixed with diffusion material contained in the diffusion material layer to form a second mixture body having a melting point higher than a melting point of the first mixture body.

This electronic component unit has a high quality and an improved tight adhesion during a heating process after bonding.

According to the present invention, it is possible to provide a high quality semiconductor device, its manufacture method and an electronic component unit.

DESCRIPTION OF THE PREFERRED EMBODIMENTS

Studies on Japanese Patent Application No. 2003-088181 proposed by the present inventors have been made vigorously and the present application proposes a high quality semiconductor device, its manufacture method and an electronic component unit.

FIGS. 1A to 1H are schematic cross sectional views illustrating a manufacture method for a semiconductor light emitting device.

Figure 1A:
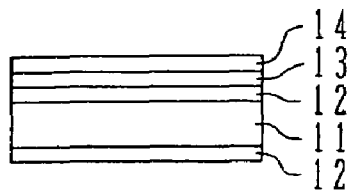
FIGS. 1A to 1H are schematic cross sectional views illustrating a method of manufacturing a semiconductor light emitting device.

Reference is made to FIG. 1A. An Au layer 12 is formed on both surfaces of a conductive substrate 11, for example, made of Si with heavily doped n- or p-type impurities, by vapor deposition, and alloyed at 400° C. in a nitrogen atmosphere. A thickness of the Au layer 12 is, e.g., 150 to 600 nm. One of the Au layers 12 has a thickness of 150 nm and the other has a thickness of 600 nm. With this alloying process, the conductive substrate 11 are integrated with the Au layers 12, forming ohmic contacts.

It is therefore possible to prevent peeling of the Au layers 12 from the conductive substrate 11 and provide a semiconductor light emitting device having good ohmic contacts, a long lifetime and high reliability. It is also possible to improve durability in a subsequent process after an alloying process in semiconductor manufacture processes.

The conductive substrate 11 may use materials other than Si having conductivity and a high thermal conductivity, such as Cu.

On the Au layer 12 (having a thickness of 150 nm), a Ti layer 13 is formed and an Ni layer 14 is formed on the Ti layer 13, by electron beam vapor deposition (EB method). The Ti layer 13 has a thickness of 100 to 200 nm, and the Ni layer 14 has a thickness of 50 to 150 nm. The Ti layer 13 and Ni layer 14 were set to 150 nm and 100 nm, respectively.

Figure 1F:
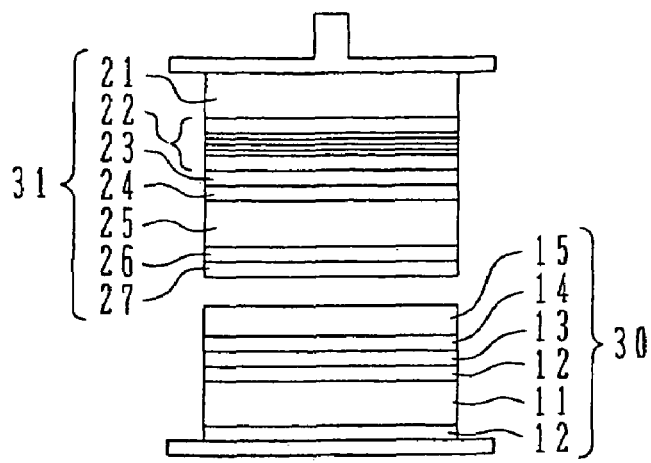
Figure 1B:
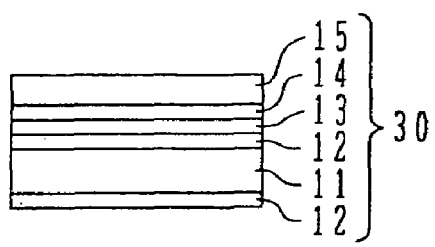

Reference is made to FIG. 1B. An AuSn layer 15 is vapor-deposited on the Ni layer 14 by a resistance heating vapor deposition method. The AuSn layer 15 has a thickness of 600 to 3000 nm. The AuSN layer 15 was set to 2000 nm. The composition of the AuSn layer 15 is preferably that Au:Sn=about 80 wt %:about 20 wt % (=about 70 at %:about 30 at %). The AuSn layer 15 had this composition. AuSn is eutectic material. If the AuSn layer 15 contains AuSn as its main component, AuSN may contain additive.

The Ti layer 13, Ni layer 14 and AuSn layer 15 may be vapor-deposited by sputtering.

A lamination structure of the conductive substrate 11, Au layer 12, Ti layer 13, Ni layer 14 and AuSn layer 15 is called a support substrate 30.

The support substrate 30 has the Ti layer 13 and Ni layer 14. Because of the tight adhesion improving effects of the Ti layer and the wettability improving effects of the Ni layer, it is possible to have sufficient reliability of tight adhesion of the final product of the conductive substrate 11. Even if the conductive substrate is heated in a later process to about 280° C. (an eutectic temperature) at which the AuSn layer 15 melts, it is possible to prevent ball-up of the AuSn layer 15 on the support substrate 30. "Ball-up" is the phenomenon that when AuSn once liquified at an eutectic temperature or higher is again solidified as the temperature lowers, AuSn is segregated on the support substrate 30 and partially swells.

Instead of the Ni layer 14, an NiV layer or a Pt layer may be formed on the Ti layer 13 to provide the ball-up preventing effects.

Figure 1C:
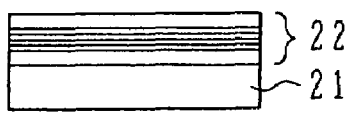

Reference is made to FIG. 1C. Next, a semiconductor substrate 21 is prepared which can lattice match with a semiconductor light emitting layer 22 epitaxially grown on the semiconductor substrate 21. By injecting electrons and holes into the semiconductor light emitting layer 22, this layer can emit light having a wavelength inherent to semiconductor.

A GaAs substrate was used as the semiconductor substrate 21. The multi-quantum well structure of the semiconductor light emitting layer 22 is formed by alternately stacking a barrier layer and a well layer of AlGaInP containing compound semiconductors having different compositions. The semiconductor light emitting layer 22 may be made of a homo pn junction structure, a double hetero (DH) structure or a single hetero (SH) structure. The structure of the semiconductor light emitting layer sandwiched between the n- and p-type clad layers is also called a semiconductor light emitting layer. The semiconductor light emitting layer 22 will be later described in detail.

Figure 1G:
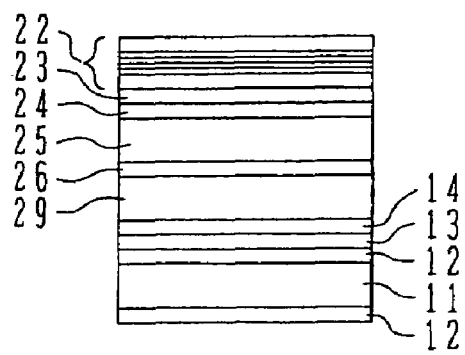
Figure 1D:
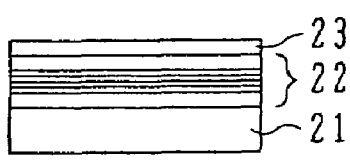

Reference is made of FIG. 1D. A reflective electrode layer 23 is formed on the semiconductor light emitting layer 22. The reflective electrode layer 23 of a manufactured semiconductor light emitting device functions not only as an electrode but also as a reflection layer for reflecting light emitted from the semiconductor light emitting layer 22 toward the side opposite to the optical output side, to the optical output side, to thereby improve the optical output efficiency of the semiconductor light emitting device.

The reflective electrode layer 23 is made of metal capable of forming an ohmic contact with the semiconductor light emitting layer 22. A surface layer of the semiconductor light emitting layer 22 is made of AlGaInP containing compound semiconductor of a p-type, and a p-side electrode having a thickness of 300 nm is formed by using AuZn. The reflective electrode layer 23 is formed on the semiconductor light emitting layer 22, for example, by a resistance heating vapor deposition method, an electron beam vapor deposition method (EB method), a sputtering method or the like.

Figure 1E:
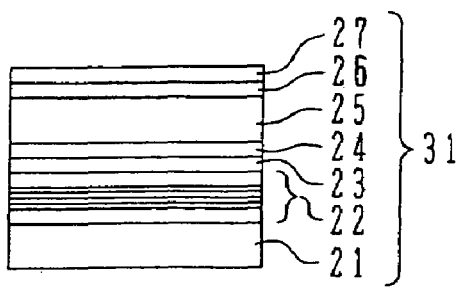

Reference is made to FIG. 1E. A TaN layer 24 of tantalum nitride (TaN) is deposited on the reflective electrode layer 23 to a thickness of 100 nm, for example, by a reactive sputtering method.

An alloying process was performed in order to have a good ohmic contact between the semiconductor light emitting layer 22 and reflective electrode layer 23 (p-side electrode). Since AuZn is adopted as the p-type AlGaInP containing compound semiconductor, heat treatment was performed at about 500° C. in a nitrogen atmosphere.

The TaN layer 24 is used for preventing eutectic material from invading (diffusing) into the reflective electrode 23 side when the support substrate 30 and the structure including the semiconductor light emitting layer 22 are bonded (metal bonding) by using eutectic material in a later process.

An Al layer 25 having a thickness of 600 nm is deposited to the TaN layer 24. For this deposition, an electron beam vapor deposition method (EB method), a resistance heating vapor deposition or the like may be used. As will be later described, the Al layer 25 contributes to improvement on tight adhesion of the semiconductor light emitting device, resultant prevention of invasion (diffusion) of eutectic material (AuSn) to the reflective electrode layer 23 side due to formation of AuSnAl alloy, and to related improvements on the quality of the semiconductor light emitting device.

A Ta (tantalum) layer 26 of 100 nm in thickness is vapor-deposited on the Al layer 25. An electron beam vapor deposition method (EB method) is used for this vapor deposition. Since Ta is refractory metal, a resistance heating vapor deposition is not suitable for the vapor deposition. By using the electron beam vapor deposition method (EB method), the Ta layer can be formed easily. A sputtering method may also be used.

As will be later described, the Ta layer 26 has a function of controlling mutual diffusion (mixture) of AuSn in the AuSn layer 15 and Al in the Al layer 25, when the support substrate 30 is bonded (metal bonding) to the structure including the semiconductor light emitting layer 22 in a later process.

An Au layer 27 having a thickness of, for example, 200 nm is stacked on the Ta layer 26. The Au layer 27 is used for forming a bonding layer together with the AuSn layer 15 of the support substrate 30, when the support substrate 30 is bonded (metal bonding) to the structure including the semiconductor light emitting layer 22 in a later process.

A lamination structure of the semiconductor substrate 21, semiconductor light emitting layer 22, reflective electrode layer 23, TaN layer 24, Al layer 25, Ta layer 26 and Au layer 27 is called a semiconductor lamination structure 31.

Reference is made to FIG. 1F. Next, the support substrate 30 and semiconductor lamination structure 31 are bonded by, for example, metal bonding. The metal bonding is a bonding method of heating to a melting point of eutectic material and applying a pressure to bond the support substrate 30 having the AuSn layer (eutectic layer) 15 and the semiconductor lamination layer 31 having the Au layer 27. Both are bonded because the AuSn layer 15 and Au layer 27 form new eutectic material (AuSn). The metal bonding was performed by tightly adhering and holding the AuSn layer 15 of the support substrate 30 and the Au layer 27 of the semiconductor lamination structure 31, under a nitrogen atmosphere, for 10 minutes at 300° C. and at a pressure of about 1 Mpa. Since the eutectic material melts during bonding, the support substrate 30 and semiconductor lamination structure 31 were bonded at a predetermined position by properly fixing them.

The bonding material, atmosphere, bonding temperature and time are not limited only to those described above, but any other bonding materials, atmospheres, bonding temperatures and times may also be used, if these conditions can bond the support substrate 30 and semiconductor lamination structure 31 by melting the eutectic material and not changing the bonding characteristics (e.g., not lowering a bonding strength by oxidation or the like).

Reference is made to FIG. 1G. After the support substrate 30 and semiconductor lamination structure 31 are bonded, the semiconductor substrate 21 (GaAs substrate) of the semiconductor lamination structure 31 is removed. The semiconductor substrate 21 was removed by wet etching using mixture etchant of ammonium and hydrogen peroxide. Removing the semiconductor substrate 21 (GaAs substrate) is not limited to wet etching, but dry etching, chemical mechanical polishing (CMP), mechanical polishing or a combination thereof may also be used.

The AuSn layer 15 of the support substrate 30 and the Au layer 27 of the semiconductor lamination structure 31 are bonded by the metal bonding in the process described with reference to FIG. 1F. A newly formed AuSn layer during this metal bonding is shown as a bonding layer 29 in FIG. 1G.

Figure 1H:
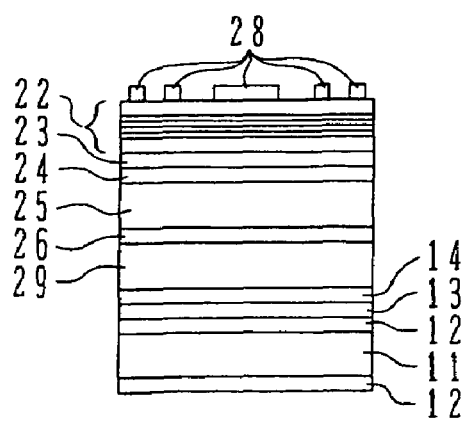

Reference is made to FIG. 1H. After the semiconductor substrate 21 is removed, front electrodes 28 are formed on the semiconductor light emitting layer 22 exposed on the surface of the semiconductor light emitting device, the front electrode being in ohmic contact with the semiconductor light emitting layer. The semiconductor light emitting layer 22 on which the front electrodes are vapor-deposited is n-type semiconductor. Therefore, the front electrode 28 can be made of the material capable of forming an ohmic contact with the n-type semiconductor, such as AuSnNi, AuGeNi, AuSn and AuGe. In this embodiment, AuSnNi was used.

The front electrode 28 is formed, for example, by a lift-off method. With the lift-off method, photoresist is coated on the semiconductor light emitting layer 22 and selectively exposed by using a photomask to form a photoresist pattern having an opening of a desired electrode shape, electrode material is vapor-deposited and thereafter the photoresist pattern and the metal layer on the photoresist pattern are removed. Vapor deposition of the electrode material may be performed by a resistance heating vapor deposition method, an electron beam vapor deposition method (EB method), a sputtering method or the like.

Alloying by heat treatment in a nitrogen atmosphere at about 400° C. was performed in order to form a good ohmic contact between the semiconductor light emitting layer 22 and front electrodes (n-side electrode) 28.

The semiconductor light emitting device was manufactured by the above-described processes.

The present inventors have studied the structure of the manufactured semiconductor light emitting device. This will be described later in detail.

Description will be made on the merits that the support substrate 30 has the Ti layer 13 and Ni layer 14. If the support substrate 30 does not have these layers and is bonded to the semiconductor lamination structure 31 by metal bonding, first, a peel-off occurs between the support substrate 30 and semiconductor lamination structure 31. Second, if the support substrate 30 is larger than the semiconductor lamination structure 31 (different from the structure shown in FIG. 1G), a ball-up of eutectic material is formed on the support substrate 30 after bonding. This ball-up results in a defect at a later photolithography process. For example, in the process described with reference to FIG. 1H, segregated eutectic material prevents the photoresist surface from being tightly adhered to the photomask. It is therefore difficult to form the front electrode 28 of a desired shape having a size of 10 µm or smaller. Even if electrode material is first vapor-deposited on the semiconductor light emitting layer 22 and then patterned into a desired electrode shape by using a photoresist pattern to thereafter remove unnecessary electrode material, there is still the influence of a ball-up so long as the photolithography process is involved. As a simple electrode forming method, there is a known shadow mask vapor deposition method. With this method, however, it is difficult to form an electrode having a size of 10 µm or smaller at a high precision.

The above-described problems can be avoided by manufacturing the semiconductor light emitting device by using the support substrate 30 having the Ti layer 13 and Ni layer 14.

Supplemental description will be made on the alloying the conductive substrate 11 and Au layer 12. In alloying them effectively, the surface layer of the Au layer 12 on the side of bonding with the semiconductor lamination structure 31 is important. Since the surface layer on the opposite side is used for electrode leads by die bonding or the like, it may be made of other electrode materials such as Ti/TiN/Al. In order to simplify processes, it is expected to use the single material. The material is not limited to Au, but other materials may be used which can form an ohmic contact with Si, such as Ni, Ti and Pt.

Figure 2A:
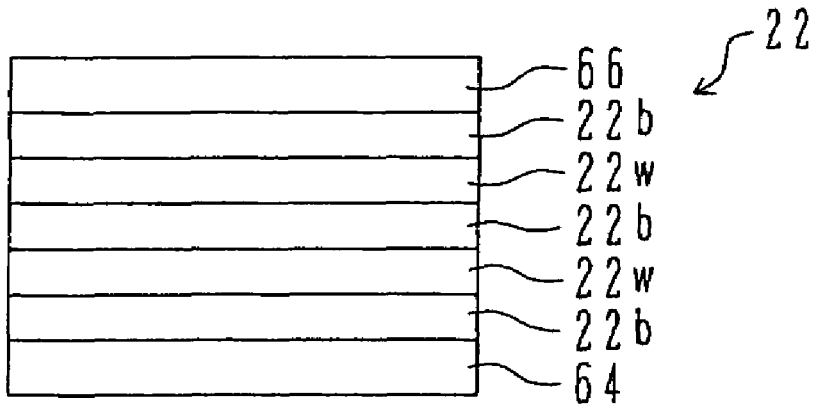
FIGS. 2A to 2C are diagrams showing the structure of a semiconductor light emitting layer 22 of a semiconductor lamination structure 31 shown in FIG. 1E.
Figure 2B:
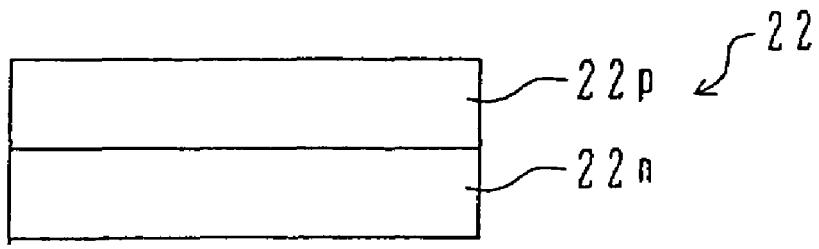
Figure 2C:
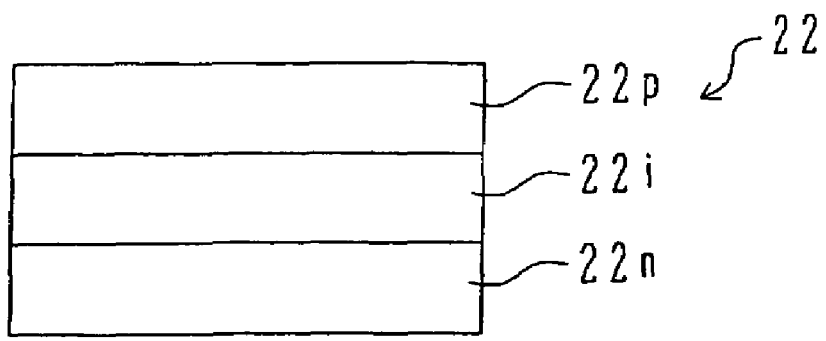

With reference to FIGS. 2A to 2C, description will be made on the structure of a semiconductor light emitting layer 22 of the semiconductor lamination structure 31 shown in FIG. 1E.

Reference is made to FIG. 2A. The semiconductor light emitting layer 22 has a multi-quantum well structure made of a lamination structure of, for example, barrier layers 22$b$ and well layers 22$w$.

Reference is made to FIG. 2B. The semiconductor light emitting device 22 may have a single hetero (SH) structure having stacked p-type semiconductor layers 22$p$ having different compositions and formed on an n-type semiconductor layer 22$n$.

Reference is made to FIG. 2C. The semiconductor light emitting device 22 may have a double hetero (DH) structure having i layers 22$i$ having different compositions and a narrow band gap and formed on an n-type semiconductor layer 22$n$, and p-type semiconductor layers 22$p$ having different compositions and a broad band gap and formed on the i layer 22$i$.

With the above-described manufacture method for the semiconductor light emitting device, by using the support substrate 30 having the Ti layer 13 and Ni layer 14 under the AuSn layer 15, a ball-up of AuSn can be prevented during bonding the support substrate 30 and semiconductor lamination structure 31. A ball-up can be suppressed perfectly or within a height of 2 µm or lower.

It can be considered that the Ti layer 13 functions as a layer having high tight adhesion to the lower Au layer 12. The Ti layer 13 is a tight adhesion improving layer for improving tight adhesion between the Au layer 12 and Ni layer 14. By forming the Ni layer 14 on the Ti layer 13, wettability of a layer formed on the Ni layer is improved. The Ni layer 14 is a wet layer for improving wettability of eutectic material AuSn, and it can be considered that improvement on the wettability by the Ni layer 14 prevents segregation of AuSn. The wet layer for AuSn is preferably made of Ni or Pt.

The tight adhesion improving layer and wet layer may be formed on the Si substrate surface. The tight adhesion improving layer and wet layer are not limited to the embodiment, but they may be used properly depending upon materials, film thickness structures and layer structures.

Figure 3:
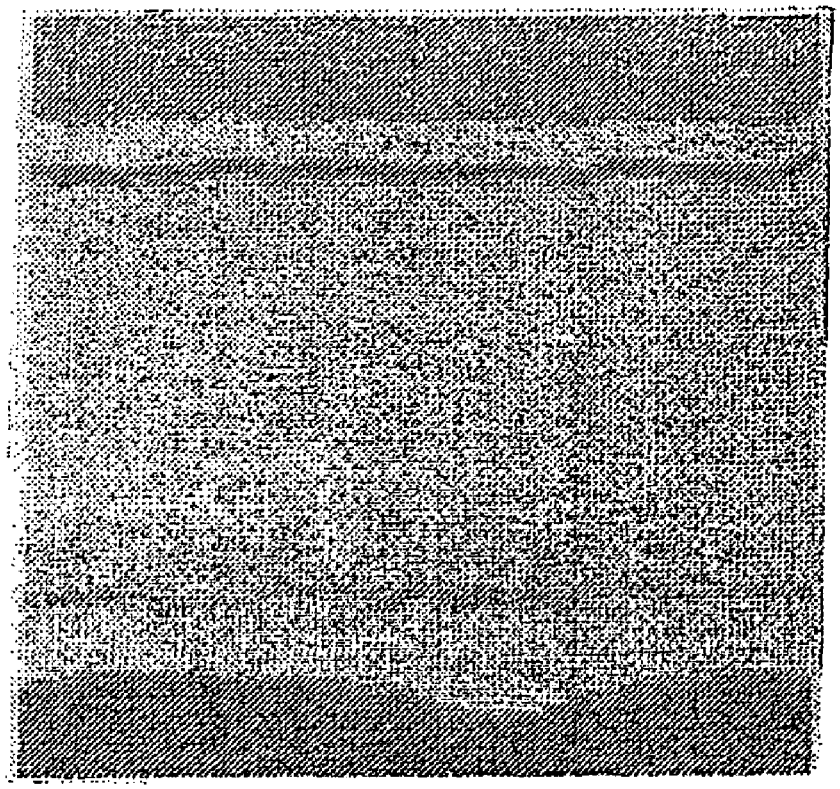
FIG. 3 is a scanning type electron microscope (SEM) photograph of a semiconductor light emitting device manufactured by the method described with reference to FIGS. 1A to 1H.
Figure 4:
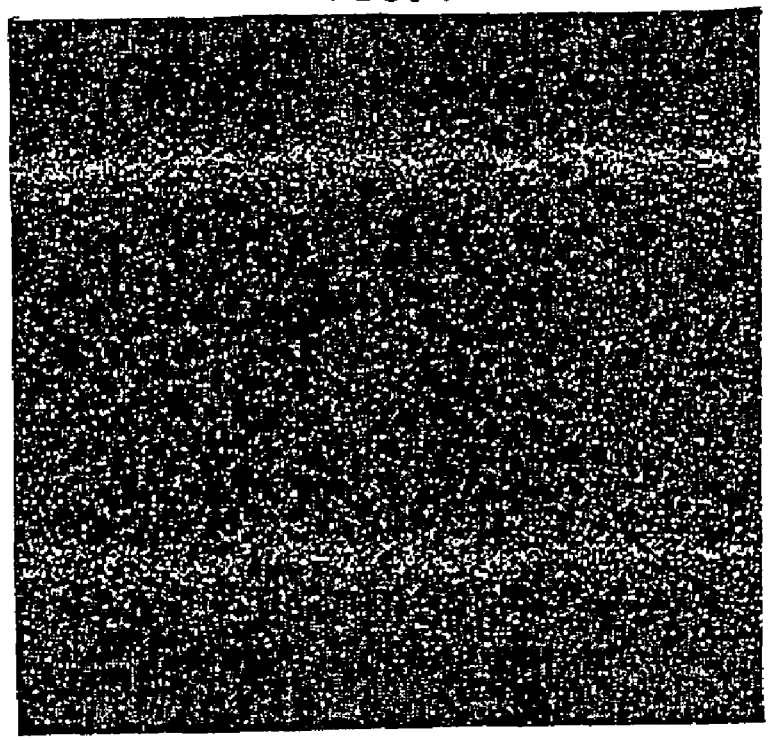
FIGS. 4 to 7 are scanning type electron microscope (SEM) photographs showing the diffusion states of Ta, Al, Au and Sn, respectively, on a scanning type electron microscope (SEM) photograph shown in FIG. 3.

FIG. 3 is a scanning electron microscope (SEM) photograph of a semiconductor light emitting device manufactured by the method described with reference to FIGS. 1A to 1H.

FIGS. 4 to 7 are scanning electron microscope (SEM) photographs showing the diffusion states of Ta, Al, Au and Sn, respectively, in the scanning electron microscope (SEM) photograph shown in FIG. 3.

Consider the diffusion distributions of Ta, Al, Au and Sn shown in FIGS. 4 to 7, with comparison between the SEM photograph shown in FIG. 3 and the schematic diagram of the semiconductor light emitting device shown in FIG. 1H. It can be seen that the SEM photograph of FIG. 3 shows: in the order from up to down, the semiconductor light emitting layer 22 made of AlGaInP containing compound semiconductor; the reflective electrode layer 23 made of AuZn; the TaN layer 24, the Al/Au/Sn layer, the Ta layer 26, the AuSn(Al) layer and the conductive substrate 11 made of Si (in this case, the conductive substrate 11 is assumed limitatively to include the upper stacked Au layer 12, Ti layer 13 and Ni layer 14).

The present inventors compared the thickness of each layer in the SEM photograph of FIG. 3 with the thickness of each layer of the support substrate 30 and semiconductor lamination structure 31 before metal bonding shown in FIG. 1F, and have confirmed that the reflective electrode layer 23 made of AuZn, TaN layer 24 and Ta layer 26 have approximately the thicknesses before metal bonding. This can be confirmed from the diffusion distribution results of Ta and Au shown in FIGS. 4 and 6.

Figure 5:
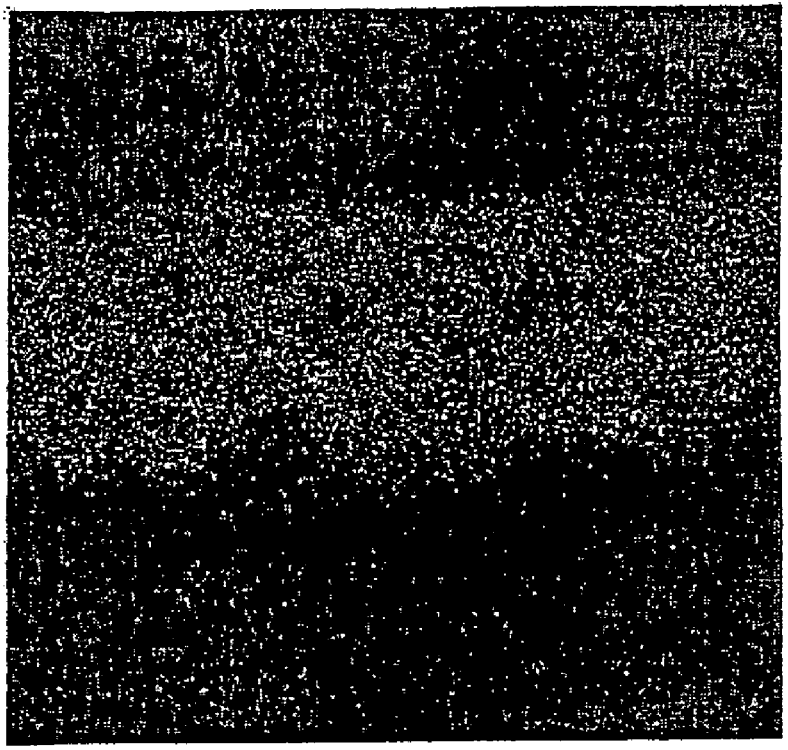
Figure 6:
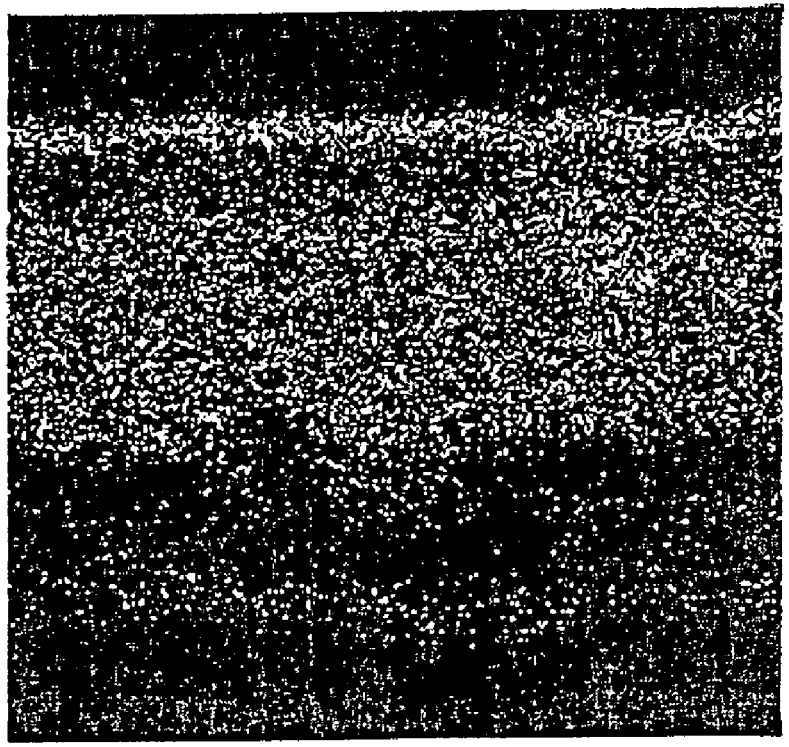
Figure 7:
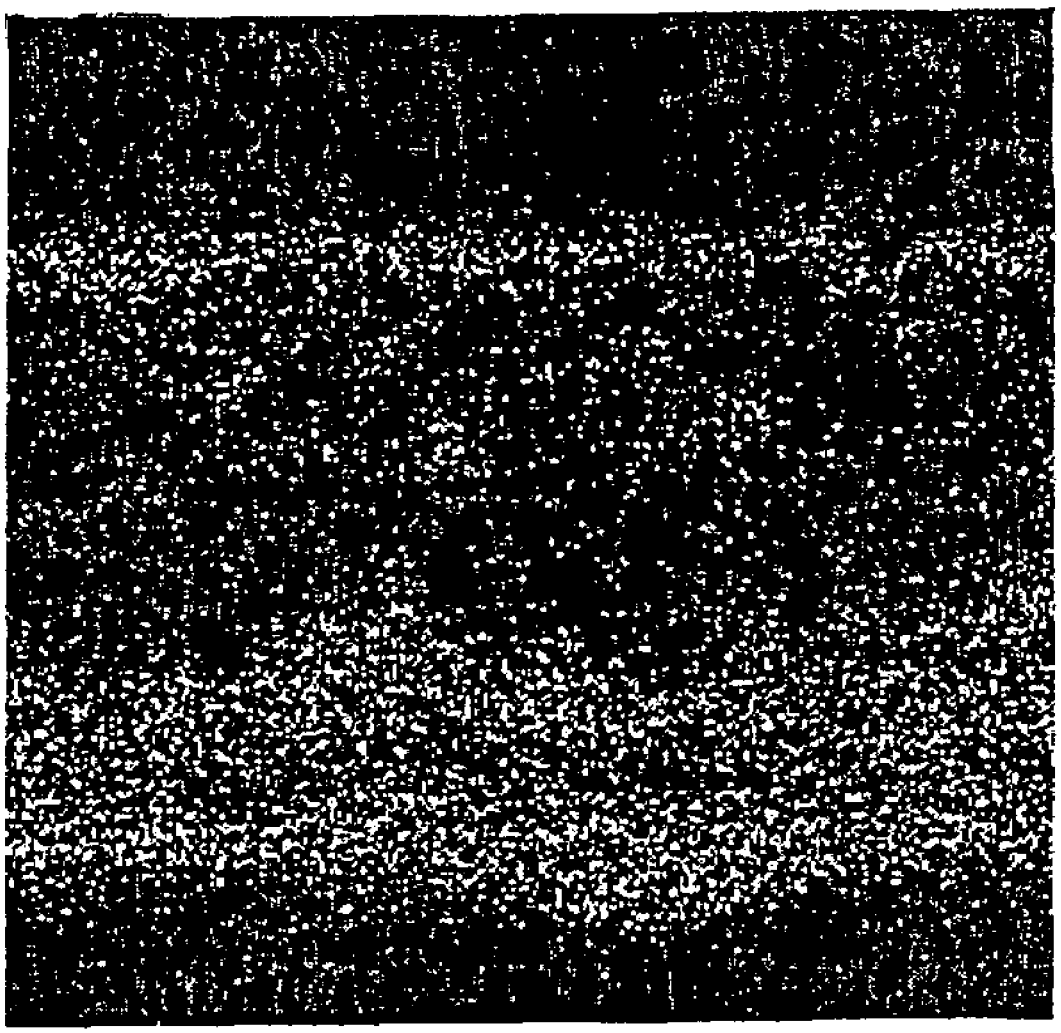

When compared with the Al layer 25 and AuSn layer 15 before bonding, the diffusion ranges of Al and Sn shown in FIGS. 5 and 7 are broader. The Ta layer 26 shown in the SEM photograph of FIG. 3 is cut or lost in intermediate areas. The present inventors have studied the semiconductor light emitting device manufactured by the method described with reference to FIGS. 1A to 1H, and have found that the Al layer 25 and AuSn layer 15 after bonding mutually diffuse and a layer containing AuSnAl is formed.

It can therefore be considered that the semiconductor light emitting device manufactured by the method described with reference to FIGS. 1A to 1H does not have the structure shown in FIG. 1H but has the structure described below.

Figure 8:
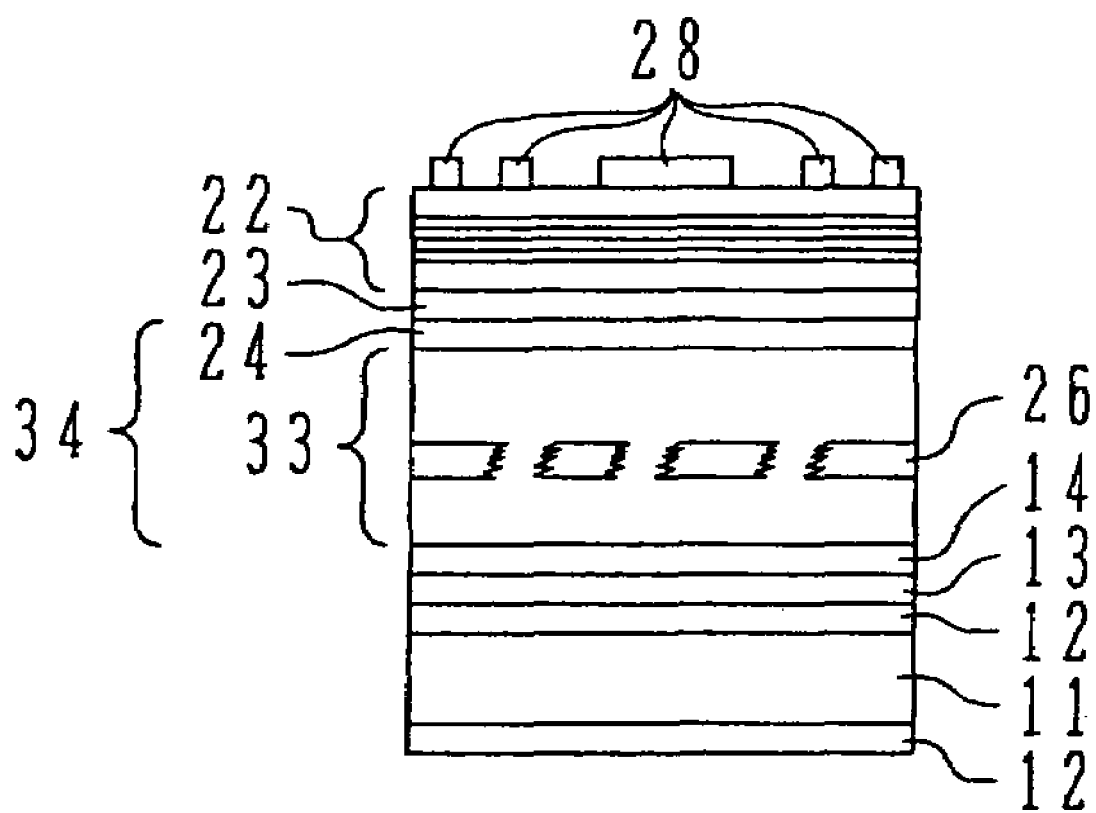
FIG. 8 is a schematic cross sectional view of a semiconductor light emitting device manufactured by the method described with reference to FIGS. 1A to 1H.

FIG. 8 is a schematic cross sectional view of a semiconductor light emitting device manufactured by the method described with reference to FIGS. 1A to 1H.

Different points from FIG. 1H reside in that the Ta layer 26 is broken, that a composite bonding layer 33 is disposed being formed by three layers including the Al layer 25, Ta layer 26 and bonding layer 29, and that a composite barrier layer 34 is disposed being formed by the composite bonding layer 33 and TaN layer 24.

The Ta layer 26 is broken during metal bonding, Al in the Al layer 25 diffuses to the bonding layer 29 through the broken Ta layer, and AuSn in the bonding layer 29 diffuses to the Al layer 25, to thereby form a mixture region. AuSnAl alloy is formed by these diffusions.

In the metal bonding process described with reference to FIG. 1F, since AuSn having the content of about 20 wt % Sn is used as the eutectic material, the AuSn layer 15 melts during bonding at about 280° C. (eutectic point, eutectic temperature). However, since AuSnAl alloy is formed thereafter by mutual diffusions, the compound bonding layer 33 will not completely melted even being heated at about 400° C. to 500° C. Since the compound bonding layer 33 having a melting point higher than that of the AuSn layer 15 is formed by mutual diffusions, it is possible to form a stable semiconductor light emitting device capable of preventing peel-off (improving tight adhesion) to be caused by the heating process after bonding.

Introducing the concept of the composite bonding layer 33 is expected to be more proper than using the three-layer structure of the Al layer 25, Ta layer 26 and bonding layer 29.

It is also considered that a bonding body having a high melting point, i.e., the composite bonding layer 33, is formed by temporarily forming a mixture body like the bonding layer 29 through mixture of eutectic contents (constituent elements of eutectic materials) Au and Sn of the AuSn layer 15 and Au layer 27 and through mixture of the AuSn mixture body and Al of the Al layer.

The present inventors have confirmed that the mutual diffusions of Al and AuSn can be controlled by a thickness of the Ta layer 26. The composition of the composite bonding layer can be controlled not only by Ta but also by other materials having a high melting point and a low solubility to the bonding material. Ti, W, Mo or the like may be used in addition to Ta.

Although the AuSn layer 15 and Au layer 27 are used for bonding the support substrate 30 and semiconductor lamination structure 31, the eutectic material containing Au as its main content, such as AuGe and AuSi, may preferably be used in addition to AuSN. The material used for bonding the semiconductor light emitting device and having an eutectic temperature higher than an electrode ohmic contact forming temperature is not preferable in order to reduce damages to the semiconductor layers. If there is a later process of mounting the semiconductor light emitting device by soldering, it is preferable to use eutectic material having an eutectic temperature higher than a melting point of general solder material (SnPb (183° C.), SnAgCu (217° C.)).

Although the Al layer is used as the diffusion material of Al, the material is not limited to Al, but Ag, Cu or alloy thereof easy to mix with Au may also be used. By selecting the material and film thickness, the Al layer not only can provide the function of supplying a diffusion material but also can provide the composite bonding layer 33 with a barrier function by forming the AuSnAl alloy. For example, by properly selecting a thickness of the Al layer 25, the composite bonding layer 33 can be provided with the barrier function so that the number of layers of the semiconductor light emitting device can be reduced. The number of manufacture processes for a semiconductor light emitting device can also be reduced.

The TaN layer 24 may be formed as desired. Even if the TaN layer 24 is formed, it is not required that the TaN layer 24 contacts the composite bonding layer 33 on the side of the reflective electrode layer 23, but it is sufficient if the TaN layer is formed between the composite bonding layer 33 and reflective electrode layer 23. The material is not limited only to TaN, other materials capable of preventing invasion of eutectic material may also be used, such as refractory metal Mo, Ta, W and the like, TiW, TiWN and the like.

With reference to photographs, description will be made on a contribution to an effective prevention of invasion (diffusion) of eutectic material (AuSn) to the reflective electrode layer 23 side, by the AuSnAl alloy formed by Al in the Al layer 25 having a thickness of 600 nm.

The present inventors manufactured semiconductor light emitting devices by the method described with reference to FIGS. 1A to 1H and light emitting devices (comparative examples) having the structure without the Al layer 25, and observed the reflective electrode layer 23 of each device made of AuZn.

Figure 9:
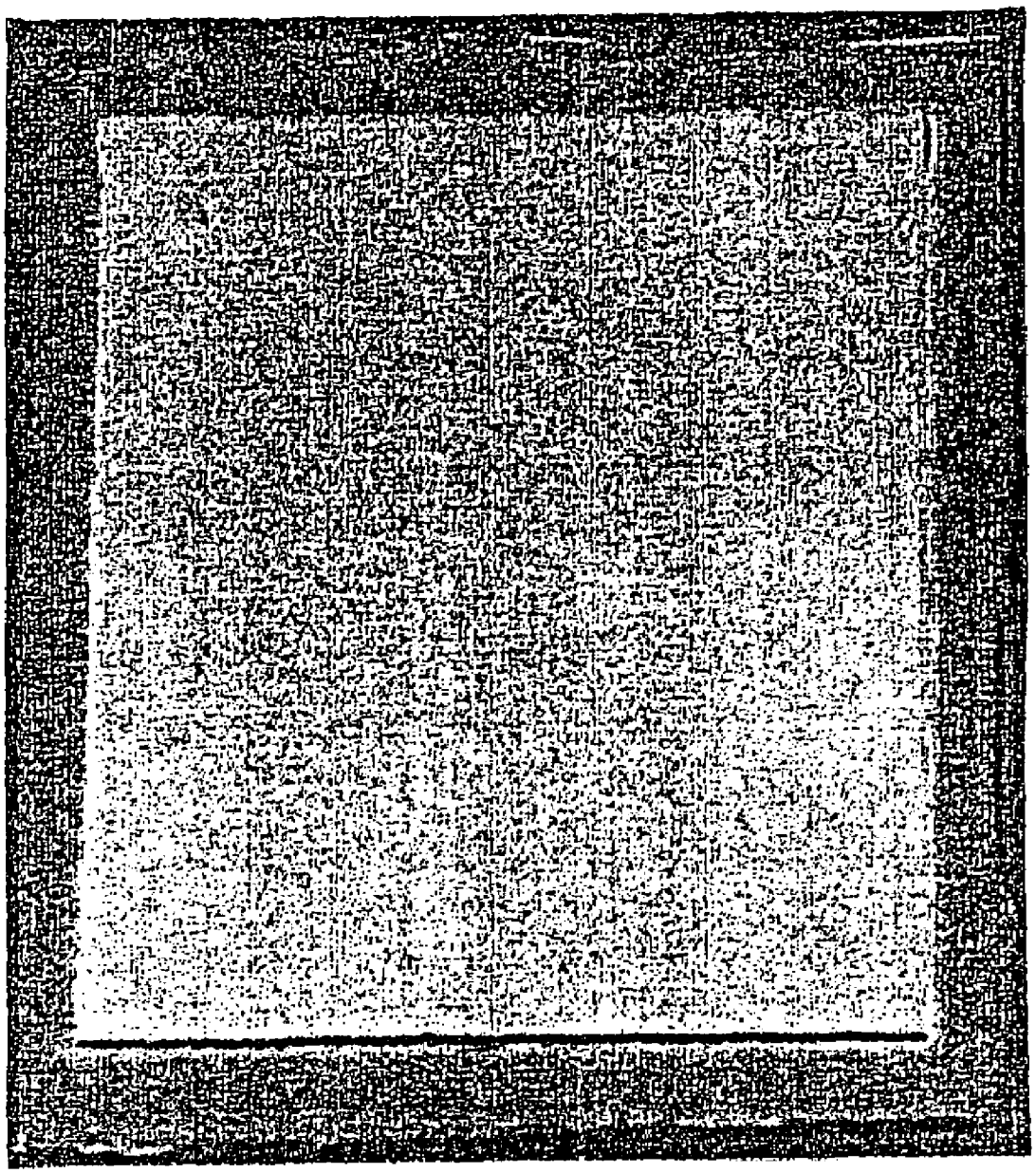
FIGS. 9 and 10 is microscope photographs of reflective electrode layers of semiconductor light emitting devices.
Figure 10:
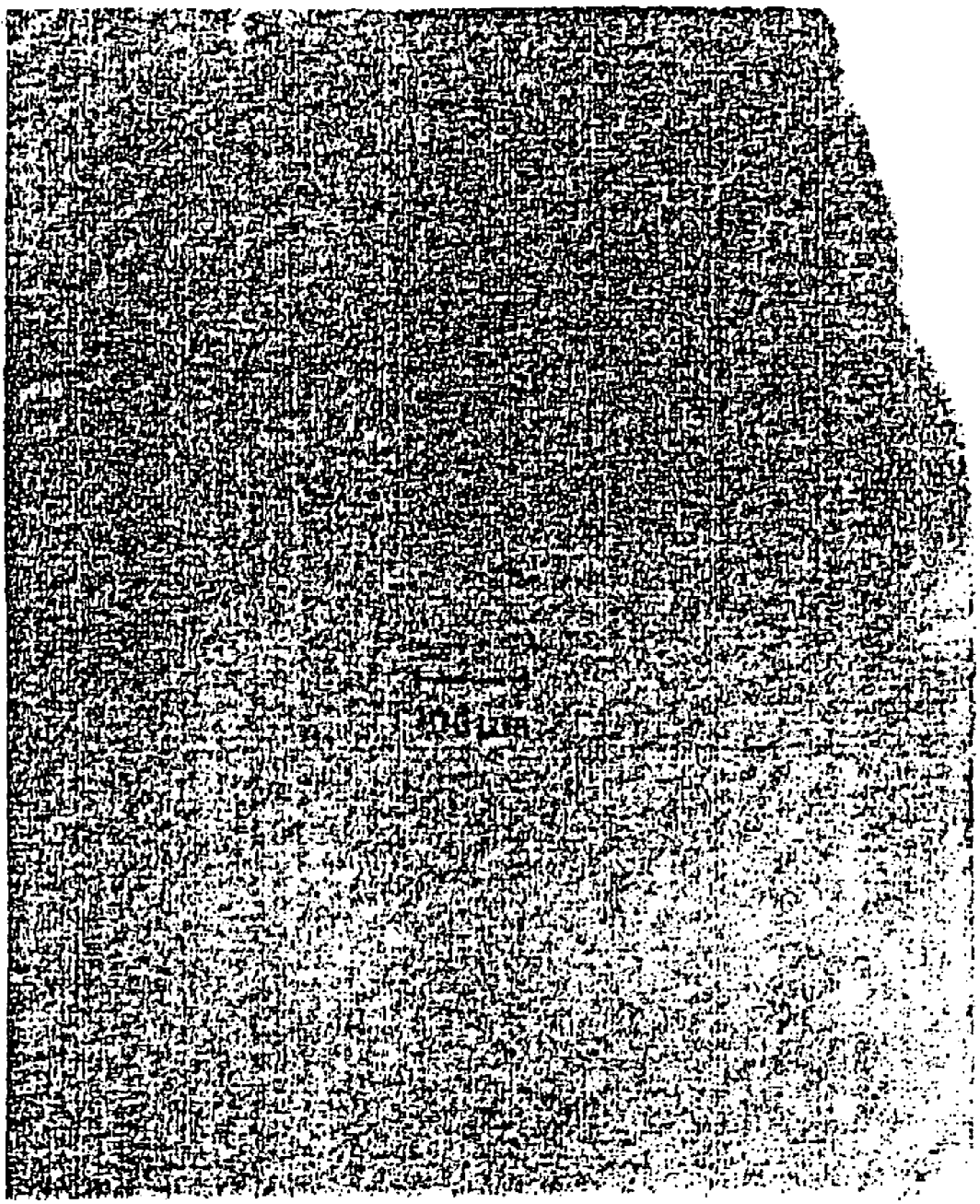

FIGS. 9 and 10 are microscope photographs showing the reflective electrode layer 23 of each semiconductor light emitting device manufactured by the method described with reference to FIGS. 1A to 1H.

Figure 11:
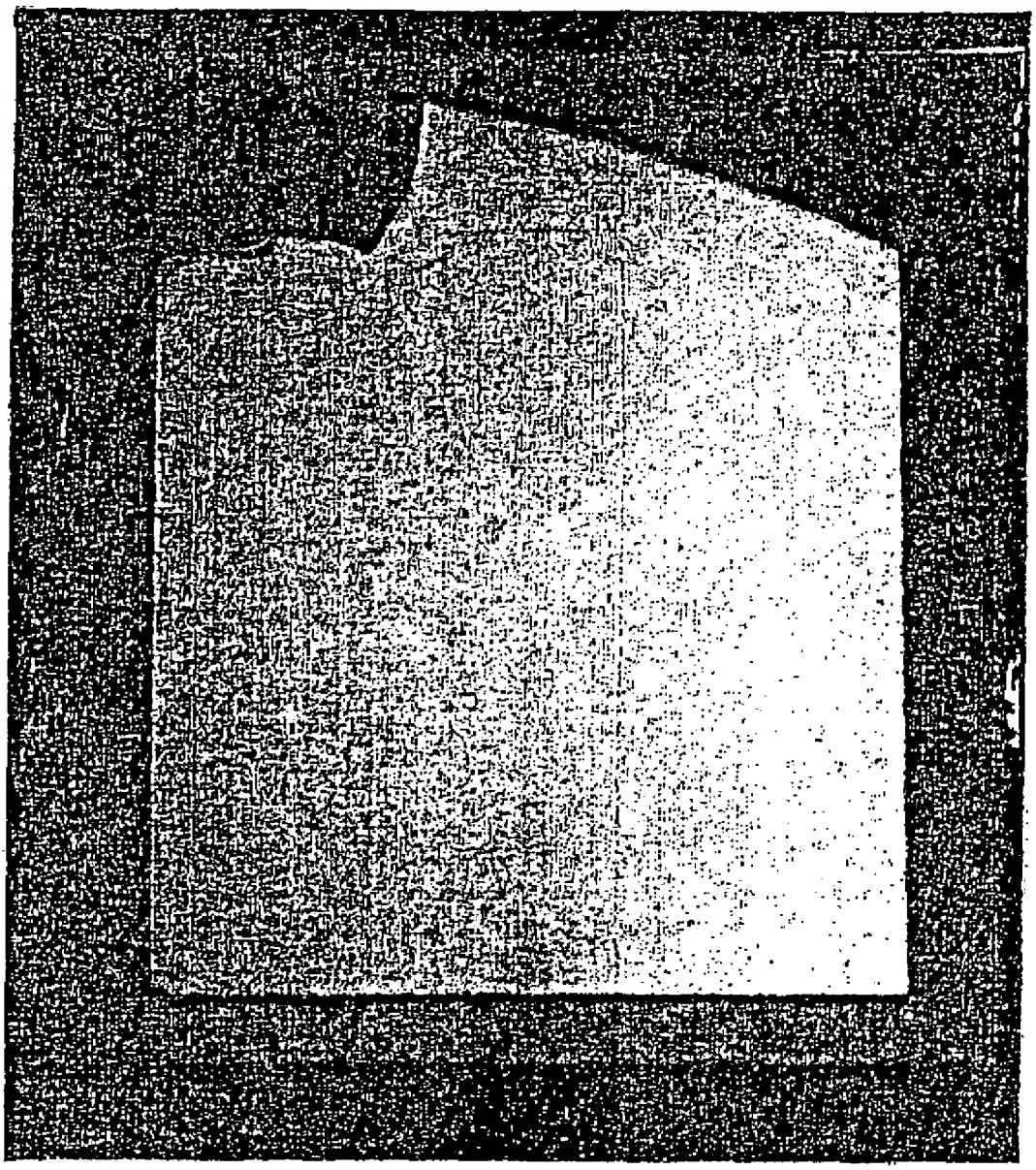
FIGS. 11 and 12 are microscope photographs of reflective electrode layers of comparative examples of the semiconductor light emitting device.
Figure 12:
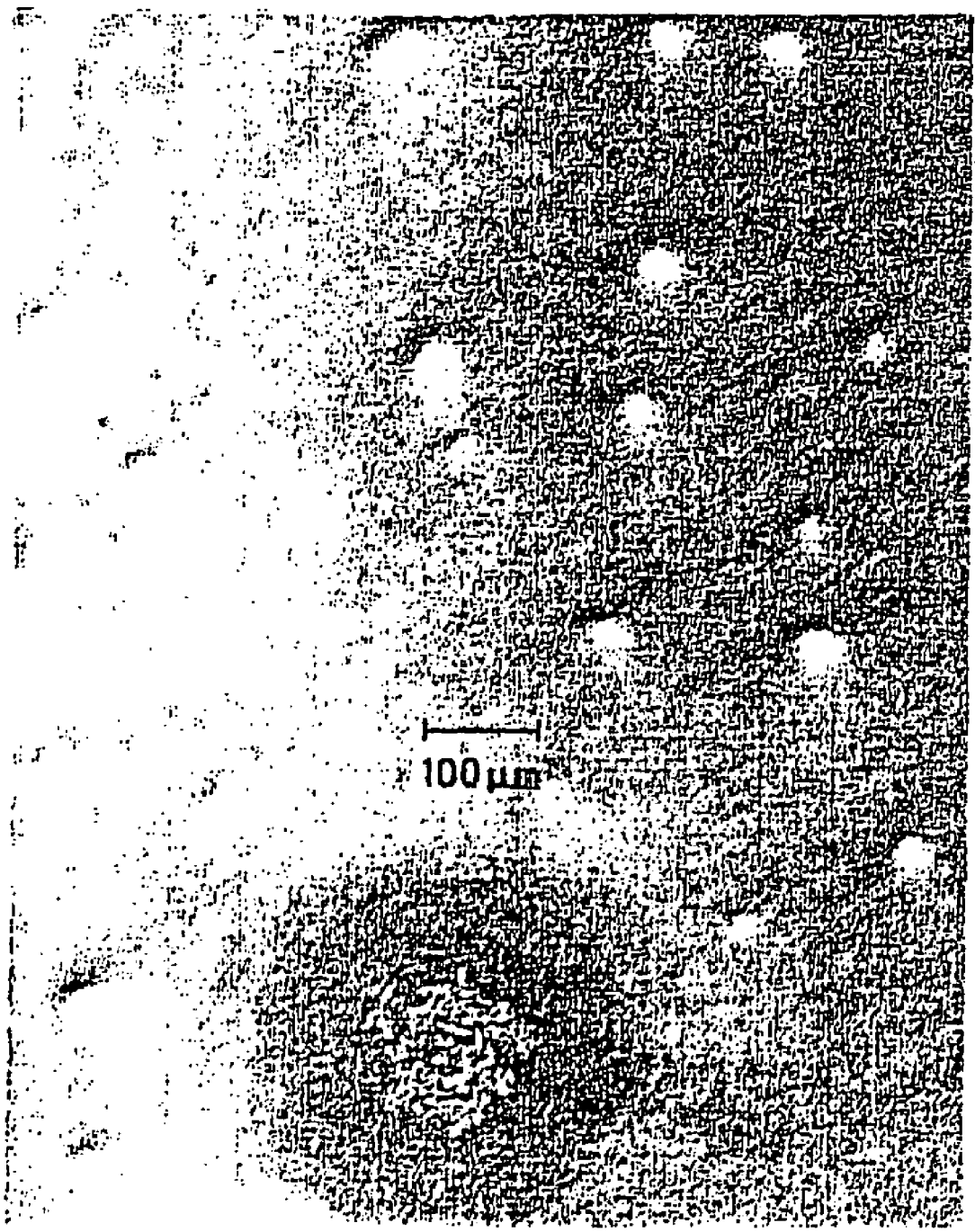

FIGS. 11 and 12 are microscope photographs showing the reflective electrode layer of each comparative example of the semiconductor light emitting device.

FIGS. 9 and 11 are plan views showing the whole outer appearances of a semiconductor light emitting device manufactured by the method described with reference to FIGS. 1A to 1H and a comparative example of the semiconductor light emitting device. FIGS. 10 and 12 are enlarged views of the central areas of the photographs shown in FIGS. 9 and 11, respectively. The reflective electrode layer made of AuZn can be confirmed in all microscope photographs shown in FIGS. 9 to 12 because the semiconductor light emitting layer is transparent.

It can be understood from the microscope photographs shown in FIGS. 9 and 10 that the reflective electrode layer of the semiconductor light emitting device manufactured by the method described with reference to FIGS. 1A to 1H has a uniform surface. It can be confirmed from the microscope photographs shown in FIGS. 11 and 12 that the reflective electrode layer of the comparative example of the semiconductor light emitting device is partially broken and has an irregular surface.

It can be understood from the four microscope photographs shown in FIGS. 9 to 12 that the Al layer of the semiconductor light emitting device manufactured by the method described with reference to FIGS. 1A to 1H is provided also with the function of a layer for protecting the reflective electrode layer. This may be ascribed to that Al and AuSn mutually diffuse during metal bonding and form the AuSnAl alloy.

As described earlier, when the semiconductor lamination structure 31 is bonded by metal bonding to the support substrate 30 by using eutectic material (AuSn), the TaN layer 24 prevents invasion (diffusion) of the eutectic material (AuSn) to the reflective electrode layer 23 side. In addition, the Al layer 25 further prevents invasion (diffusion) of the eutectic material (AuSn) to the reflective electrode layer 23 side. By forming the TaN layer 24 and Al layer 25, it is possible to prevent diffusion and mixture of the elements toward the reflective electrode layer 23 and prevent the reflection or electrode function of the reflective electrode layer from being degraded. By forming the TaN layer 24 and Al layer 25, it is possible to prevent elements from diffusing toward the reflective electrode layer 23 side and being mixed and to prevent the reflection function or electrode function of the reflective electrode layer 23 from being degraded, while the support substrate 30 and semiconductor lamination structure 31 are bonded together.

The present inventors visually compared and observed the semiconductor light emitting devices manufactured by the method described with reference to FIGS. 1A to 1H and comparative examples of the light emitting device. It was confirmed that the comparative example of the semiconductor light emitting device had a slanted upper surface of the final device, and this slanted upper surface was not confirmed for the semiconductor light emitting devices manufactured by the method described with reference to FIGS. 1A to 1H. This may be ascribed to a raised melting point due to the formation of AuSnAl by mixture of Al and AuSn.

With reference to other photographs, description will be made on highly reliable bonding of the semiconductor light emitting devices manufactured by the method described with reference to FIGS. 1A to 1H.

Figure 22:
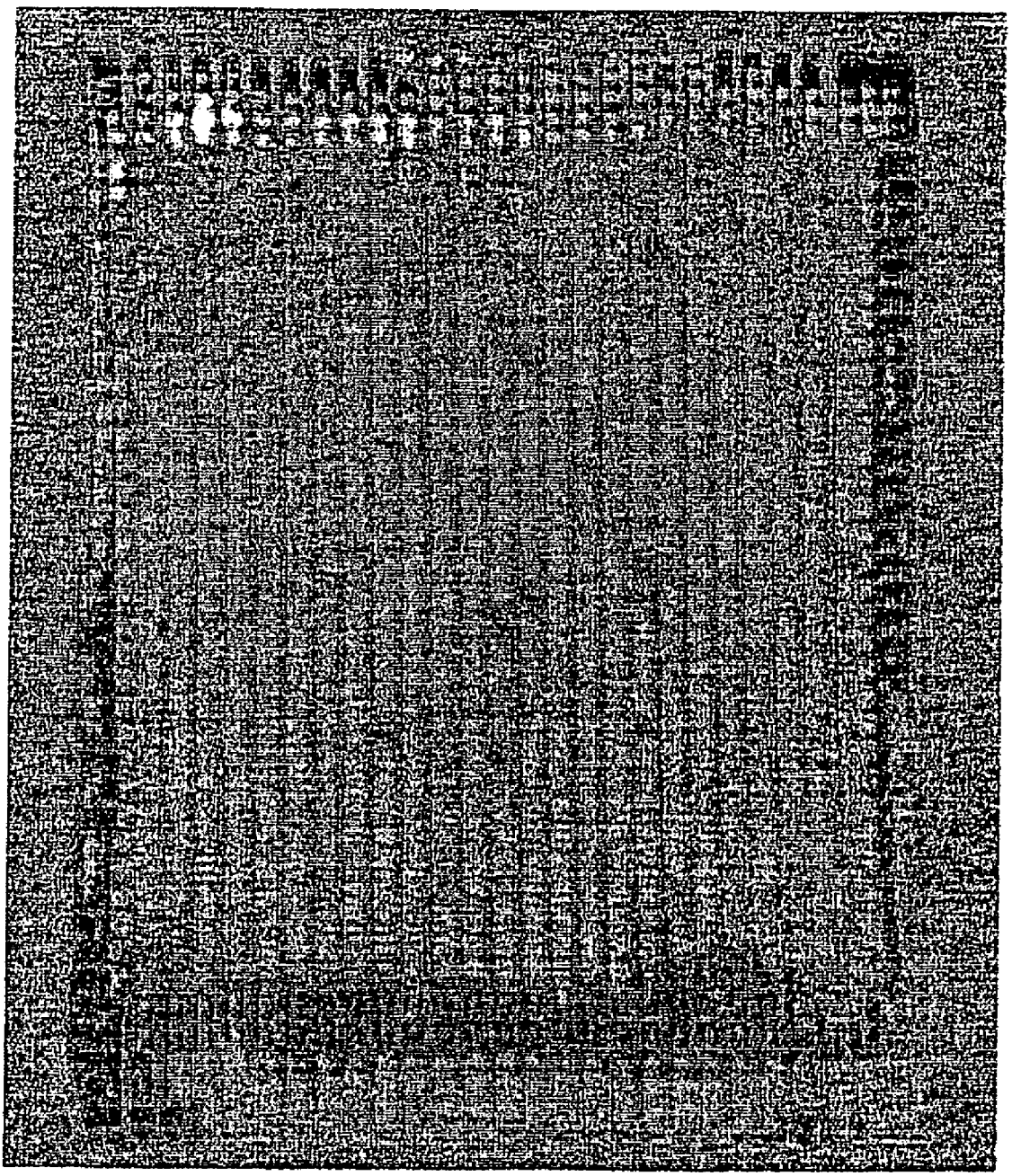
FIG. 22 is a microscope photograph of a semiconductor light emitting device manufactured by the method illustrated with reference to FIGS. 1A to 1H, as viewed from a front electrode 28 side after a dicing process.
Figure 23:
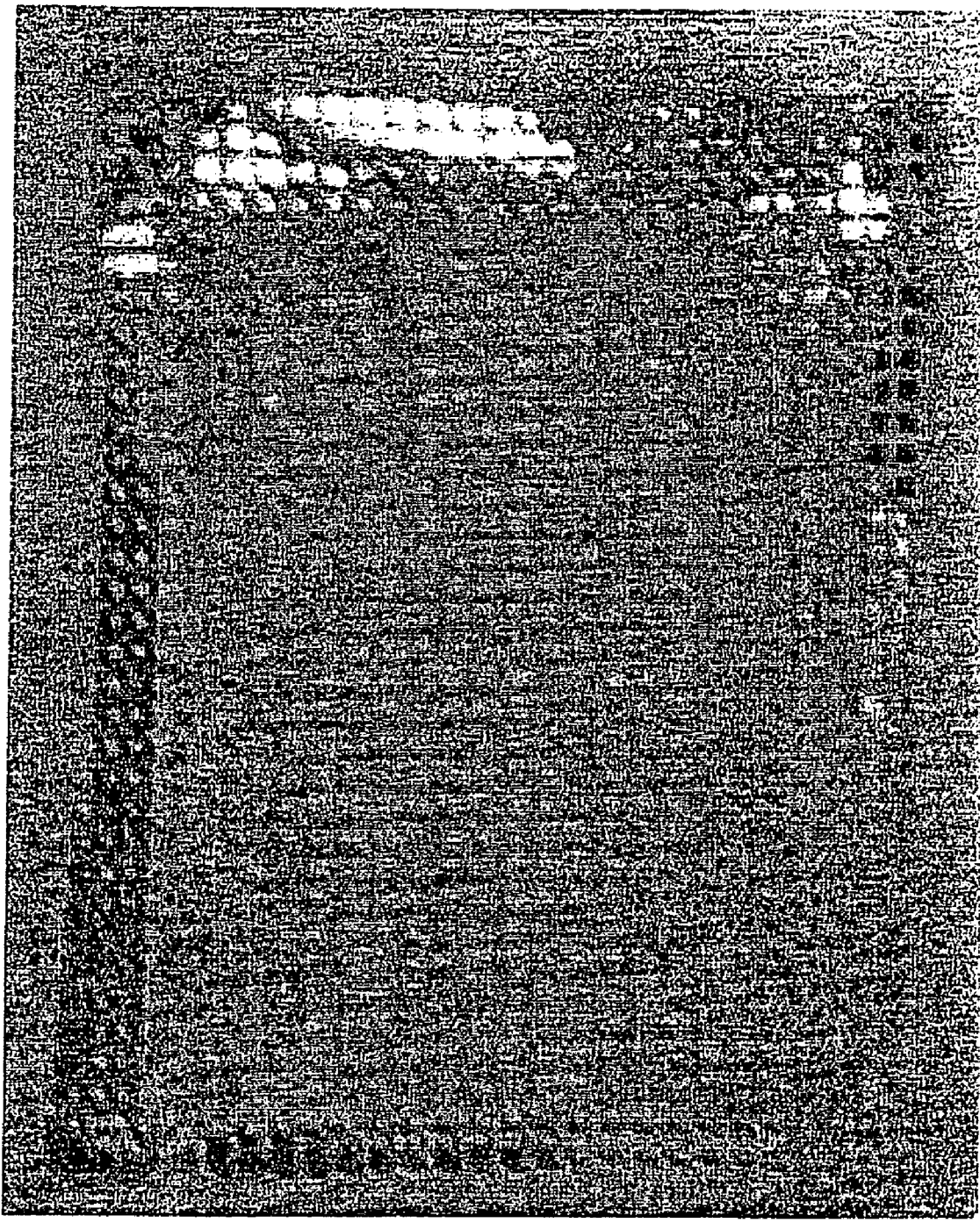
FIG. 23 is a microscope photograph of a comparative example of a semiconductor light emitting device, as viewed from a front electrode 28 side after a dicing process.

FIGS. 22 and 23 are microscope photographs of a semiconductor light emitting device manufactured by the method described with reference to FIGS. 1A to 1H and a comparative example of the light emitting device, photographed from the front electrode 28 side after a dicing process (one of later processes after the bonding process).

Reference is made to the photograph of FIG. 22. The whole area of the photograph is blackish. No peel-off was observed for the semiconductor light emitting device manufactured by the method described with reference to FIGS. 1A to 1H.

Reference is made to the photograph of FIG. 23. A whitish area of the microscope photograph corresponds to a peel-off area. Peel-off was observed in about 80% of the photograph area of the comparative example of the semiconductor light emitting device. In the comparative example of the semiconductor light emitting device, the layers from the TaN layer 24 to the semiconductor light emitting layer 22 were peeled off from the composite bonding layer 33 and lost, and the composite bonding layer 33 was observed and photographed directly. It was uncertain whether the peel-off occurred at the interface between the TaN layer 24 and composite bonding layer 33.

It can be understood from the two microscope photographs shown in FIGS. 22 and 23 that the Al layer of the semiconductor light emitting device manufactured by the method described with reference to FIGS. 1A to 1H contributes to highly reliable bonding.

In the comparative example having low bonding reliability, peel-off occurred due to vibration of a dicing blade, jet water flow and the like during the dicing process.

Next, description will be made on semiconductor light emitting devices having similar effects to those of the semiconductor light emitting device manufactured by the method described with reference to FIGS. 1A to 1H.

Figure 13A:
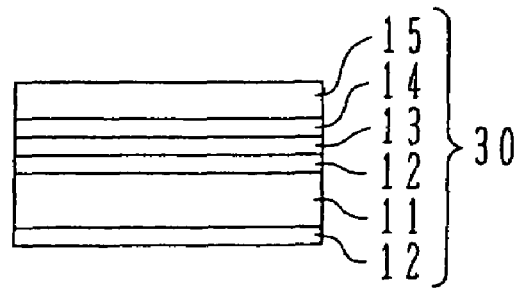
FIGS. 13A to 13C to FIGS. 17A to 17C are schematic cross sectional views illustrating manufacture methods for first to fifth semiconductor light emitting devices having effects similar to those of a semiconductor light emitting device manufactured by the method illustrated with reference to FIGS. 1A to 1H.
Figure 13B:
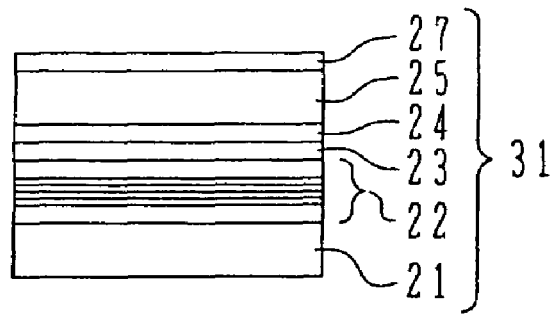
Figure 13C:
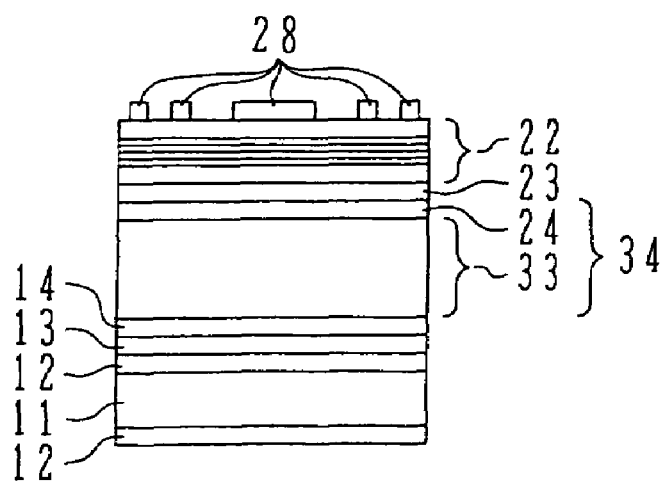

FIGS. 13A to 13C are schematic cross sectional views illustrating a manufacture method for a first semiconductor light emitting device having similar effects to those of the device shown in FIG. 8. It can be considered that the Ta layer is not essential because the fact that the AuSnAl alloy formed after the Ta layer is broken and Al in the Al layer and AuSn in the bonding layer are mixed, contributes to the high quality of the device.

Reference is made to FIG. 13A. FIG. 13A corresponds to FIG. 1B. A support substrate 30 similar to the support substrate 30 shown in FIG. 1B is formed by the processes described with reference to FIGS. 1A and 1B.

Reference is made to FIG. 13B. FIG. 13B corresponds to FIG. 1E. In FIG. 1E, the Ta layer 26 is formed between the Al layer 25 and Au layer 27. A different point in FIG. 13B is that an Au layer 27 is formed on an Al layer 25.

Other layers are formed by processes similar to those described with reference to FIGS. 1C to 1E to form a semiconductor lamination structure 31.

Reference is made to FIG. 13C. FIG. 13C corresponds to FIG. 8. The support substrate 30 and semiconductor lamination structure 31 are bonded to form a semiconductor light emitting device, by processes similar to those described with reference to FIGS. 1F to 1H.

As compared to the semiconductor light emitting device shown in FIG. 8, a different point of the semiconductor light emitting device shown in FIG. 13C is that the Ta layer 26 is not included in the composite bonding layer 33.

Figure 14A:
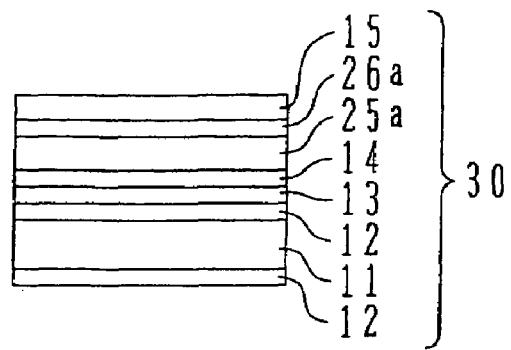
Figure 14B:
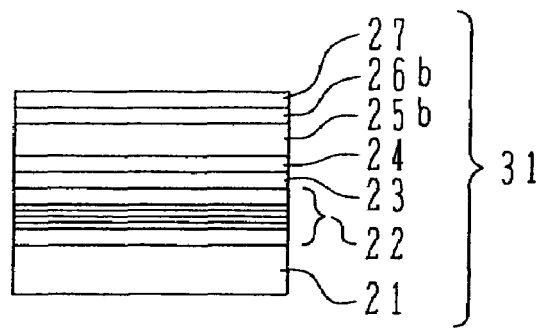
Figure 14C:
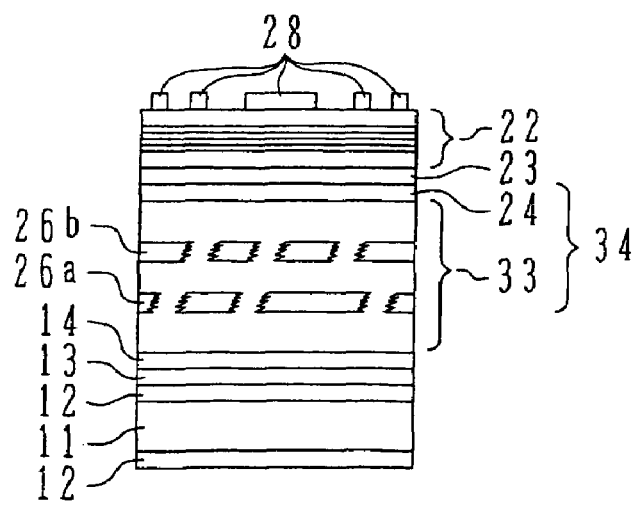

FIGS. 14A to 14C are schematic cross sectional views illustrating a manufacture method for a second semiconductor light emitting device having similar effects to those of the device shown in FIG. 8. This semiconductor light emitting device is characterized in that an AuSn layer 15 and an Au layer 27 directly used for bonding when the support substrate 30 and semiconductor lamination structure 31 are bonded, are each sandwiched between Al layers via Ta layers. The Al layer supplying Al for forming the AuSnAl alloy through mixture of AuSn may be formed not only on one side of the bonding layer, but also on both sides sandwiching the bonding layer.

Reference is made to FIG. 14A. FIG. 14A corresponds to FIG. 1B. As compared to FIG. 1B, a different point of FIG. 14A is that an Al layer 25a and a Ta layer 26a are formed between an Ni layer 14 and an AuSiN layer 15.

The Al layer 25a having a thickness of, e.g., 3 µm is formed on the Ni layer 14, and the Ta layer 26a having a thickness of, e.g., 0.1 µm is formed on the Al layer. Both layers are formed, for example, by an electron beam vapor deposition method (EB method).

Other layers are formed by processes similar to those described with reference to FIGS. 1A and 1B to form a support substrate 30.

Reference is made to FIG. 14B. FIG. 14B corresponds to FIG. 1E. Although the semiconductor light emitting devices shown in FIGS. 1E and 14B have the common layer structure, the Al layer 25 shown in FIG. 1E has a thickness of 600 nm, an Al layer 25b shown in FIG. 14B has a thickness of 3 µm.

Other layers are formed by processes similar to those described with reference to FIGS. 1C to 1E to form a semiconductor lamination structure 31.

Reference is made to FIG. 14C. FIG. 14C corresponds to FIG. 8. The support substrate 30 and semiconductor lamination structure 31 are bonded to form a semiconductor light emitting device, by processes similar to those described with reference to FIGS. 1F to 1H.

As compared to the semiconductor light emitting device shown in FIG. 8, different points of the semiconductor light emitting device shown in FIG. 14C reside in that the composite bonding layer 33 includes two broken Ta layers 26a and 26b and that the AuSnAl alloy is formed by diffusion materials (Al) from the two Al layers 25a and 25b sandwiching the bonding layer (AuSn layer 15 and Au layer 27) via the Ta layers.

It can be considered that prevention of diffusion of AuSn to the reflective electrode side is mainly realized by Al in the Al layer 25b on the reflective electrode side and AuSn in the bonding layer.

Figure 15A:
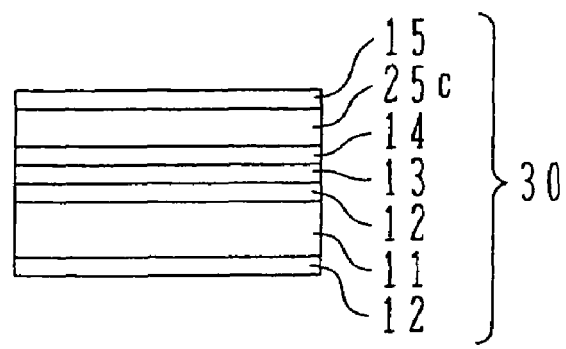
Figure 15B:
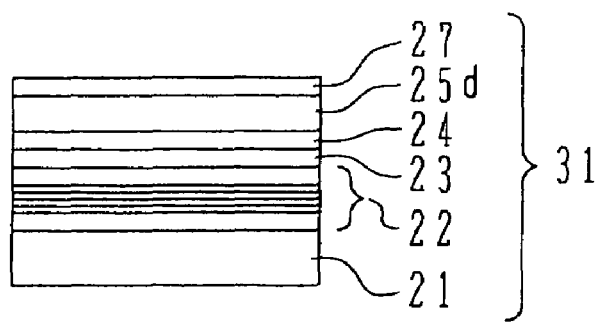
Figure 15C:
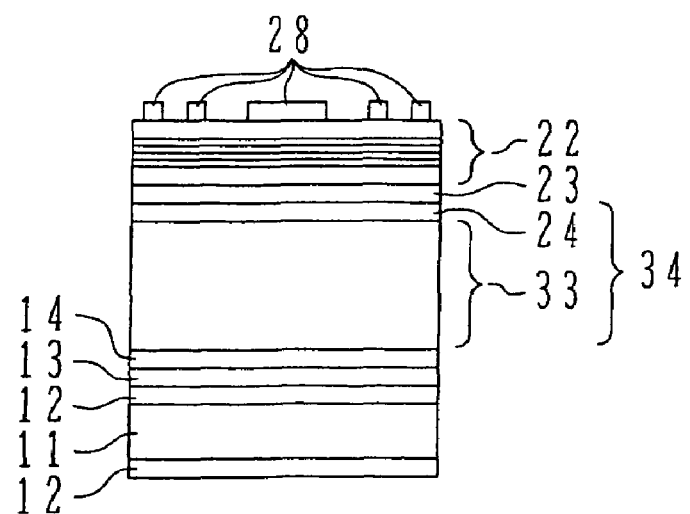

FIGS. 15A to 15C are schematic cross sectional views illustrating a manufacture method for a third semiconductor light emitting device having similar effects to those of the device shown in FIG. 8. This semiconductor light emitting device is similar to the second semiconductor light emitting device having similar effects to those of the device shown in FIG. 8. As compared to the second semiconductor light emitting device, a different point of the third semiconductor light emitting device is that the Ta layer is not formed.

Reference is made to FIG. 15A. FIG. 15A corresponds to FIG. 14A. As compared to FIG. 14A, a different point of FIG. 15A is that only an Al layer 25c is formed between an Ni layer 14 and an AuSn layer 15.

The Al layer 25c having a thickness of 3 µm is formed on the Ni layer 14, for example, by an electron beam vapor deposition method (EB method).

Other layers are formed by processes similar to those described with reference to FIGS. 1A and 1B to form a support substrate 30.

Reference is made to FIG. 15B. FIG. 15B corresponds to FIG. 14B. As compared to FIG. 14B, a different point of the semiconductor light emitting device shown in FIG. 15B is that only an Al layer 25d is formed between a TaN layer 24 and an Au layer 27.

The Al layer 25d having a thickness of 3 µm is formed on the TaN layer 24, for example, by an electron beam vapor deposition method (EB method).

Other layers are formed by processes similar to those described with reference to FIGS. 1C to 1E to form a semiconductor lamination structure 31.

Reference is made to FIG. 15C. FIG. 15C corresponds to FIG. 14C. The support substrate 30 and semiconductor lamination structure 31 are bonded to form a semiconductor light emitting device, by processes similar to those described with reference to FIGS. 1F to 1H.

As compared to the semiconductor light emitting device shown in FIG. 14C, a different point of the semiconductor light emitting device shown in FIG. 15C is that the compound bonding layer 33 does not include the Ta layer.

Figure 16A:
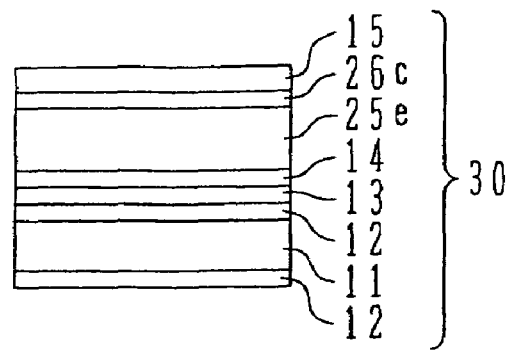
Figure 16B:
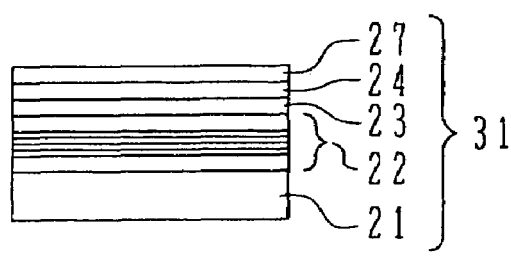
Figure 16C:
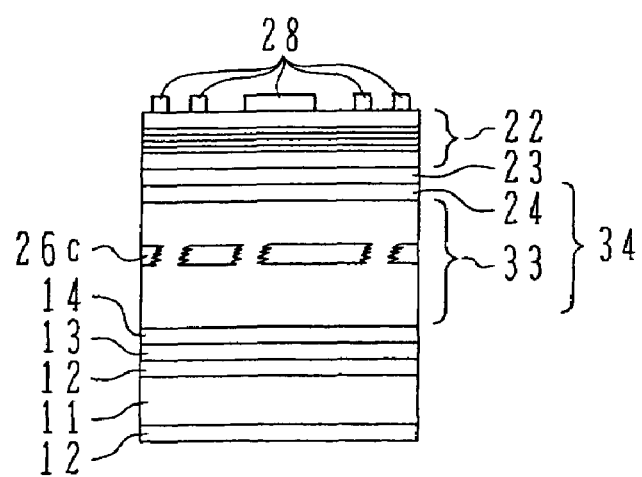

FIGS. 16A to 16C are schematic cross sectional views illustrating a manufacture method for a fourth semiconductor light emitting device having similar effects to those of the device shown in FIG. 8. In the manufacture method described with reference to FIGS. 1A to 1H, the Al layer and Ta layer are formed in the semiconductor lamination structure 31. A different point of the fourth semiconductor light emitting device is that the Al layer and Ta layer are formed in the support substrate 30.

Reference is made to FIG. 16A. FIG. 16A corresponds to FIG. 1B. As compared to FIG. 1B, a different point of FIG. 16A is that an Al layer 25e and a Ta layer 26c are formed between an Ni layer 14 and an AuSin layer 15.

The Al layer 25e having a thickness of, e.g., 6 µm is formed on the Ni layer 14, and the Ta layer 26c having a thickness of, e.g., 0.1 µm is formed on the Al layer. Both layers are formed, for example, by an electron beam vapor deposition method (EB method).

Other layers are formed by processes similar to those described with reference to FIGS. 1A and 1B to form a support substrate 30.

Reference is made to FIG. 16B. FIG. 16B corresponds to FIG. 1E. As compared to FIG. 1E, in FIG. 16B, the Al layer 25 and Ta layer 26 are not formed, and an Au layer 27 is formed directly on a TaN layer 24.

Other layers are formed by processes similar to those described with reference to FIGS. 1C to 1E to form a semiconductor lamination structure 31.

Reference is made to FIG. 16C. FIG. 16C corresponds to FIG. 8. The support substrate 30 and semiconductor lamination structure 31 are bonded to form a semiconductor light emitting device, by processes similar to those described with reference to FIGS. 1F to 1H.

As compared to the semiconductor light emitting device shown in FIG. 8, the semiconductor light emitting device shown in FIG. 16C has the same layer structure as a whole, although the element distribution in the composite bonding layer 33 is different.

Figure 17A:
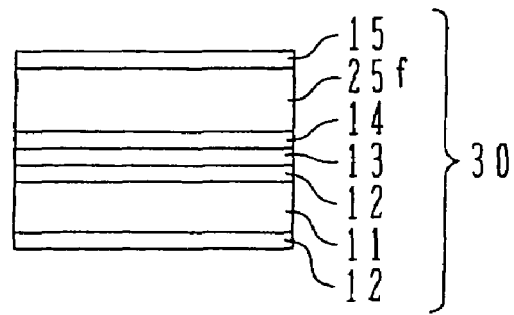
Figure 17B:
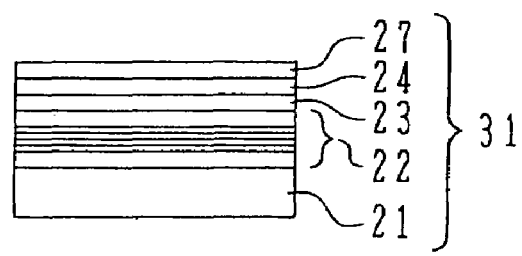
Figure 17C:
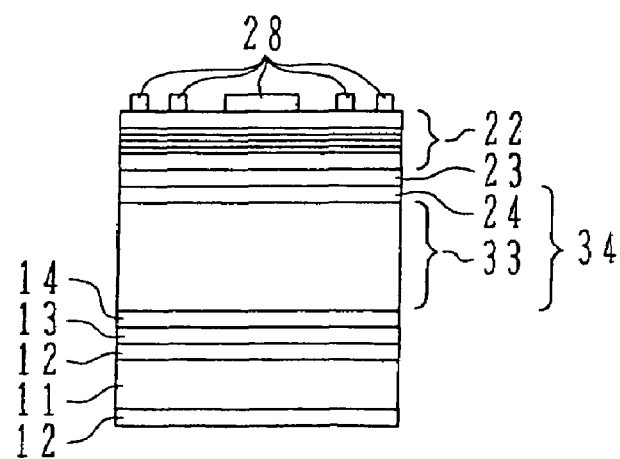

FIGS. 17A to 17C are schematic cross sectional views illustrating a manufacture method for a fifth semiconductor light emitting device having similar effects to those of the device shown in FIG. 8. The fifth semiconductor light emitting device is similar to the fourth semiconductor light emitting device. As compared to the fourth semiconductor light emitting device, a different point of the fifth semiconductor light emitting device is that the Ta layer is not formed.

Reference is made to FIG. 17A. FIG. 17A corresponds to FIG. 16A. As compared to FIG. 16A, a different point of FIG. 17A is that only an Al layer 25*f* is formed between an Ni layer 14 and an AuSin layer 15.

The Al layer 25*f* having a thickness of, e.g., 3 μm is formed on the Ni layer 14, for example, by an electron beam vapor deposition method (EB method).

Other layers are formed by processes similar to those described with reference to FIGS. 1A and 1B to form a support substrate 30.

Reference is made to FIG. 17B. FIG. 17B corresponds to FIG. 16B. A semiconductor lamination structure 31 is formed by processes similar to those described with reference to FIG. 16B.

Reference is made to FIG. 17C. FIG. 17C corresponds to FIG. 16C. The support substrate 30 and semiconductor lamination structure 31 are bonded to form a semiconductor light emitting device, by processes similar to those described with reference to FIGS. 1F to 1H.

As compared to the fourth semiconductor light emitting device shown in FIG. 16C, a different point of the semiconductor light emitting device shown in FIG. 17C is that the composite bonding layer 33 does not include the Ta layer.

The semiconductor light emitting devices having the reflective electrode layer (AuZn layer) having both the functions of the electrode layer and reflection layer have been described above. The functions of the electrode layer and reflection layer may be divided.

Figure 18A:
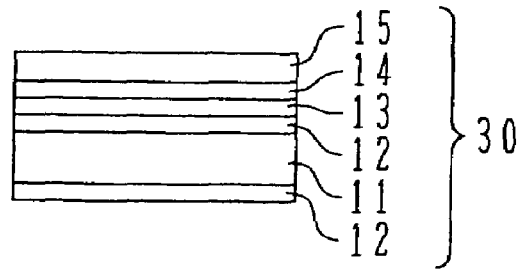
FIG. 18A to 18C are schematic cross sectional views illustrating a manufacture method of a semiconductor light emitting device having both electrode and reflection layers.
Figure 18B:
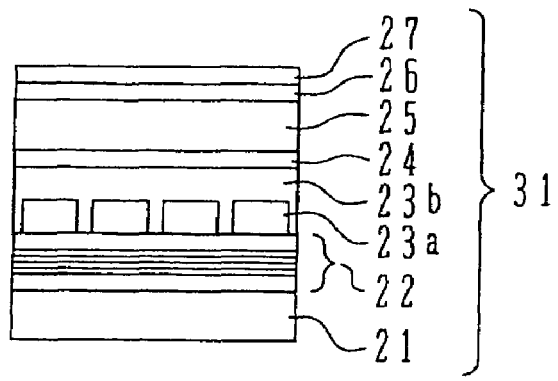
Figure 18C:
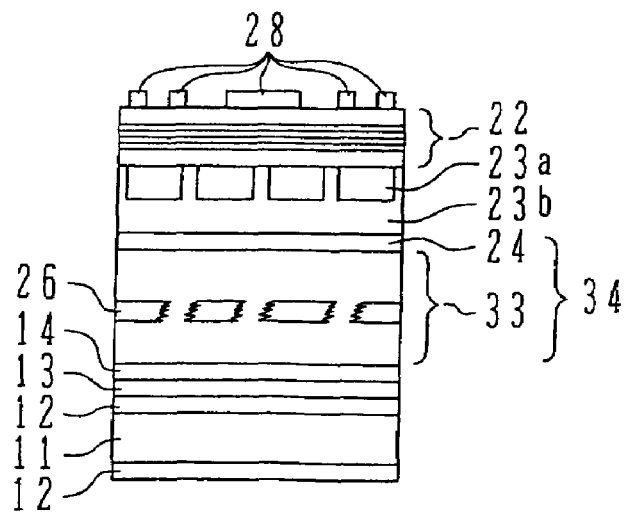
Figure 19:
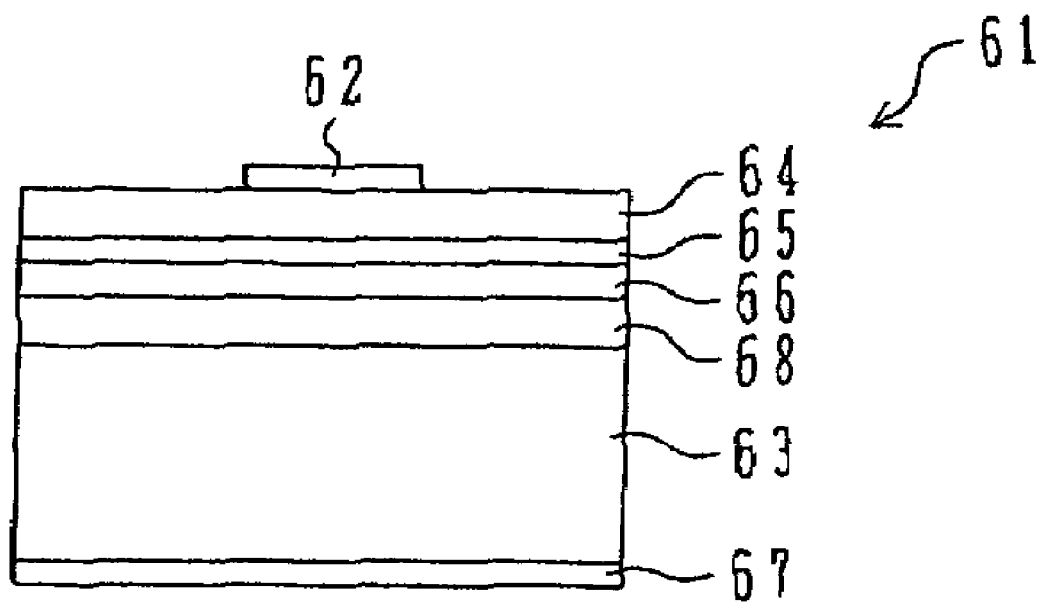
FIG. 19 is a schematic cross sectional view showing an example of a conventional semiconductor light emitting device.
Figure 20A:
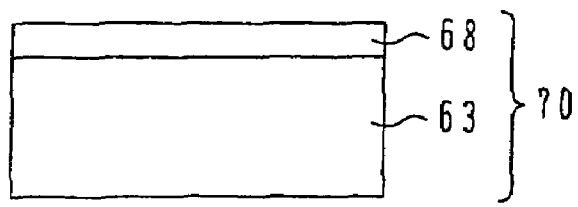
FIGS. 20A to 20D are schematic cross sectional views illustrating a manufacture method for the semiconductor light emitting device 61 shown in FIG. 19.
Figure 20B:
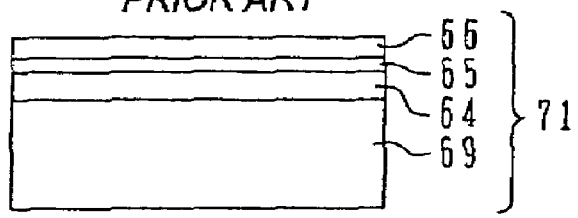
Figure 20C:
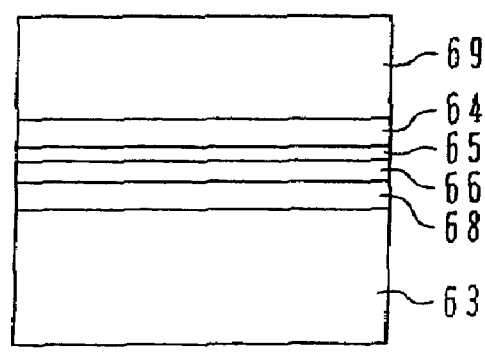
Figure 20D:
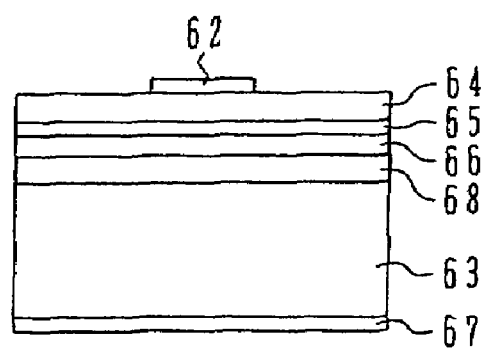

FIGS. 18A to 18C are schematic cross sectional views illustrating a manufacture method for a semiconductor light emitting device having an electrode layer and a reflection layer.

Reference is made to FIG. 18A. FIG. 18A corresponds to FIG. 1B. A support substrate 30 similar to the support substrate 30 shown in FIG. 1B is formed by the processes described with reference to FIGS. 1A and 1B.

Reference is made to FIG. 18B. FIG. 18B corresponds to FIG. 1E.

A reflection layer 23*a* having a thickness of, e.g., 0.1 μm and made of, e.g., $SiO_2$ is formed on a semiconductor light emitting layer 22. The reflection layer 23*a* is formed by a sputtering method, an EB method, a CVD method or the like.

The reflection layer 23*a* may be made of compound semiconductor, dielectric material other than $SiO_2$, metal or the like.

An electrode layer 23*b* having a thickness of, e.g., 0.6 μm and made of, e.g., AuZn alloy is formed on a semiconductor light emitting layer 22 and the reflection layer 23*a*. The electrode layer 23*b* is formed by a sputtering method, a resistance heating vapor deposition method or the like.

If a surface layer of the semiconductor light emitting layer 22 is, for example, p-type compound semiconductor, the electrode layer 23 may be made of AuBe alloy or the like well-known as p-side electrode material.

Other layers are formed by processes similar to those described with reference to FIGS. 1C to 1E to form a semiconductor lamination structure 31.

Reference is made to FIG. 18C. FIG. 18C corresponds to FIG. 8. The support substrate 30 and semiconductor lamination structure 31 are bonded to form a semiconductor light emitting device having independent electrode and reflection layers instead of the reflective electrode layer, by processes similar to those described with reference to FIGS. 1F to 1H.

Figure 21A:
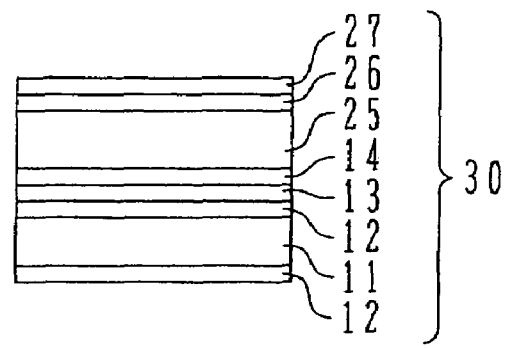
FIGS. 21A to 21C are schematic cross sectional views illustrating a manufacture method for a sixth semiconductor light emitting device having effects similar to those of a semiconductor light emitting device manufactured by the method illustrated with reference to FIGS. 1A to 1H.
Figure 21B:
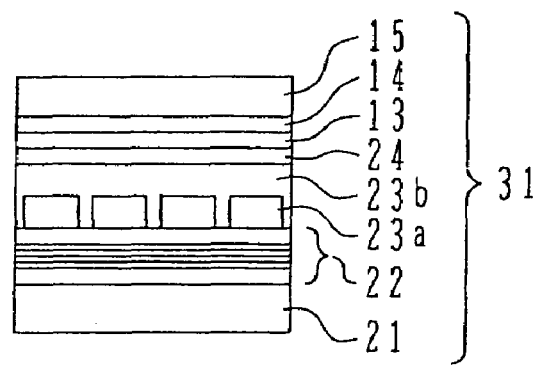
Figure 21C:
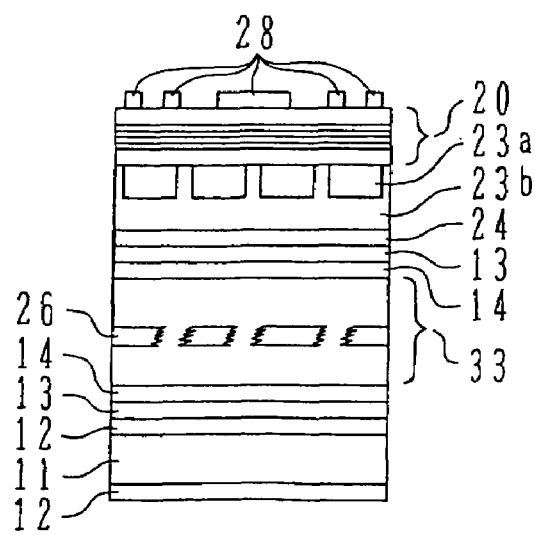

FIGS. 21A to 21C are schematic cross sectional views illustrating a manufacture method for a sixth semiconductor light emitting device having similar effects to those of the device shown in FIG. 8.

Reference is made to FIG. 21A. FIG. 21A corresponds to FIG. 18A (FIG. 1B). As compared to FIG. 18A, a different point of FIG. 21A is that although the AuSn layer 15 is formed on the Ni layer 14 in FIG. 18A, an Al layer 25, a Ta layer 26 and an Au layer 27 are stacked in this order on an Ni layer 14 in FIG. 21A.

The Al layer 25 having a thickness of, e.g., 6 μm is formed on the Ni layer 14, and the Ta layer 26 having a thickness of, e.g., 0.1 μm is formed on the Al layer, for example, by an electron beam vapor deposition method (EB method). The Au layer 27 having a thickness of e.g., 0.3 μm is formed on the Ta layer 26.

Other layers are formed by processes similar to those described with reference to FIG. 18A to form a support substrate 30.

When the structure including the semiconductor light emitting layer is metal-bonded to the support substrate 30 at a later process by using eutectic material, the Au layer 27 is used for forming a bonding layer together with an AuSn layer in the structure.

Reference is made to FIG. 21B. FIG. 21B corresponds to FIG. 18B. As compared to FIG. 18B, a different point of FIG. 21B is that although the Al layer 25, Ta layer 26 and Au layer 27 are stacked in this order on the TaN layer 24 in FIG. 18B, a Ti layer 13, an Ni layer 14 and an AuSn layer 15 are stacked in this order on a TaN layer 24 in FIG. 21B.

The Ti layer 13 having a thickness of, e.g., 0.15 μm is formed on the TaN layer 24, and the Ni layer 14 having a thickness of, e.g., 0.1 μm is formed on the Ti layer, for example, by an electron beam vapor deposition EB method). The AuSn layer 15 having a thickness of, e.g., 2 μm is formed on the Ni layer 14 by a resistance heating vapor deposition method. Other layers are formed by processes similar to those described with reference to FIG. 18B to form a semiconductor lamination structure 31.

Reference is made to FIG. 21C. FIG. 21C corresponds to FIG. 18C. The support substrate 30 and semiconductor lamination structure 31 are bonded to form a semiconductor light emitting device, by processes similar to those described with reference to FIG. 18C.

In the sixth semiconductor light emitting device, the Ti layer 13 and Ni layer 14 are formed in both the support substrate 30 and semiconductor lamination structure 31. The Ti layer 13 is a tight adhesion improving layer presenting high adhesion to a lower layer (e.g., the conductive substrate 11 integrated with the Au layer 12 in the support substrate 30 shown in FIG. 21A). The Ni layer is a wet layer for improving wettability of an upper layer (e.g., the AuSn layer 15 in the semiconductor lamination structure 31 shown in FIG. 21B).

The Ti layer 13 and Ni layer 14 may be formed as desired. If these layers are formed, they may be formed either in the support substrate 30 or in the semiconductor lamination structure 31. They may be formed in both the support substrate 30 and semiconductor lamination structure 31. Only the Ti layer 13 may be formed or only the Ni layer 14 may be formed.

In FIGS. 21A and 21B, the Au layer 27 is formed on the support substrate 30 and the AuSn layer 15 is formed on the semiconductor lamination structure 31. This structure is also available in which the AuSn layer 15 is not formed on the support layer 30 and the Au layer 27 is not formed on the semiconductor lamination structure 31.

By forming the composite bonding layer, it is possible to manufacture not only high quality semiconductor devices but also high quality electronic component units or the like. For example, the composite bonding layer is applicable to bonding of electronic components to be manufactured at a higher bonding (adhesion) temperature in a succeeding process than a bonding (adhesion) temperature in a preceding process.

FIGS. 24A to 24D are schematic cross sectional views illustrating a manufacture method for an electronic component unit.

Figure 24A:
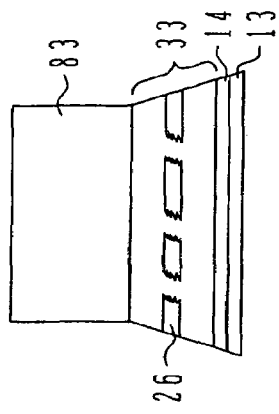
FIGS. 24A to 24D are schematic cross sectional views illustrating a manufacture method for electronic component units.

Reference is made to FIG. 24A. A base lamination region 82 is formed on a mount 81 above a base 80. An electronic component 84 is formed by adding a bonding region to a semiconductor chip 83 including a semiconductor light emitting device.

Figure 24C:
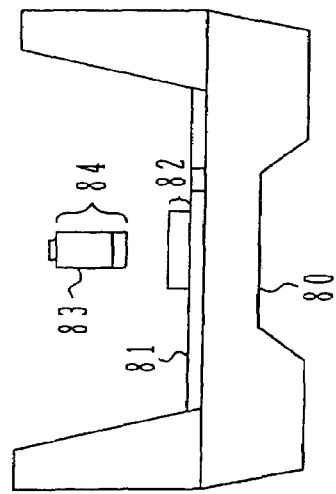
Figure 24B:
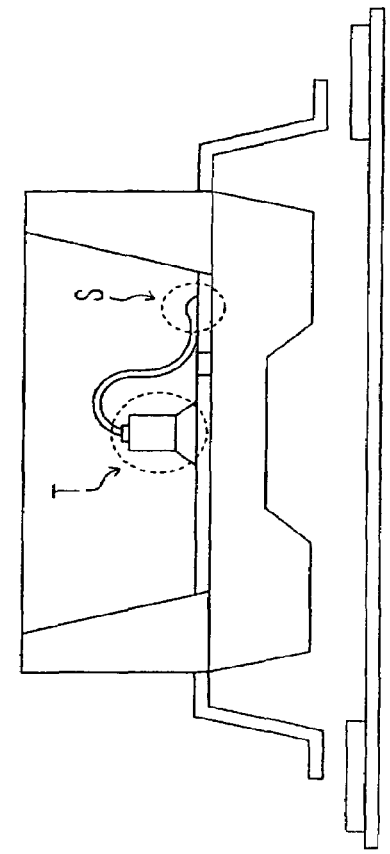

Reference is made to FIG. 24B corresponding to FIG. 1F.

The base lamination region 82 is constituted of a Ti layer 13, an Ni layer 14 and an AuSn layer 15 stacked on the mount 81 in this order from the bottom. The base lamination region 82 corresponds to the support substrate 30 shown in FIG. 1B and having the Ti layer 13, Ni layer 14 and AuSn layer 15 formed on the substrate.

The electronic component 84 is constituted of an Al layer 25, a Ta layer 26 and an Au layer 27 stacked on the semiconductor chip 83 in this order from the bottom. The electronic component 84 corresponds to the semiconductor lamination structure 31 shown in FIG. 1E. The semiconductor chip 83 corresponds to the semiconductor light emitting layer 22 of the semiconductor lamination structure 31 shown in FIG. 1E. In the semiconductor lamination structure 31, the reflective electrode layer 23 and TaN layer 24 are formed between the semiconductor light emitting layer 22 and Al layer 25. Different from the semiconductor lamination structure, the reflective electrode layer and TaN layer are not formed in the electronic component 84.

The semiconductor chip 83 added with the bonding region (Al layer 25, Ta layer 26 and Au layer 27) is die-bonded to the mount 81 by using the bonding region and the base lamination region 82.

Reference is made to FIG. 24C corresponding to FIG. 8. FIG. 24C shows the bonding state of the base lamination region 82 and electronic component 84.

A bonding body (composite bonding layer 33) having a melting point higher than that of AuSn mixture is considered to be formed in the following manner. Eutectic contents (constituent elements of eutectic materials) of the AuSn layer 15 and Au layer 27 are mixed to temporarily form AuSn mixture which is mixed with Al in the Al layer via the broken regions of the Ta layer 26.

Different from the semiconductor lamination structure 31 of the semiconductor light emitting device shown in FIG. 8, the reflective electrode layer 23 and TaN layer 24 are not formed in the electronic component 84.

Figure 24D:
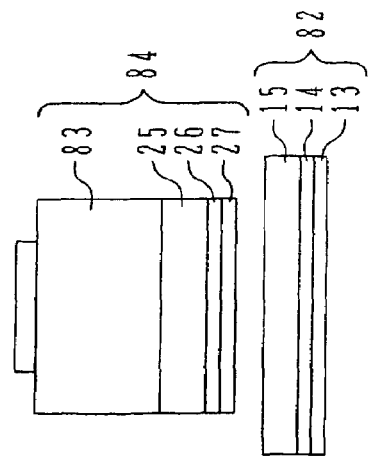

Reference is made to FIG. 24D. After die-bonding of the electronic component indicated by T, external terminals using eutectic material are mounted and fixed as indicated by S to thereby form a package unit (electronic component unit) 85.

Since the composite bonding layer 33 is formed between the semiconductor chip 83 and base lamination region 82 by the die-bonding process, high tight adhesion can be retained between the semiconductor chip 83 and base lamination region 82 even during the mounting process which requires a higher temperature than that of the die-bonding process.

For example, if In is used as eutectic material for the die-bonding process, the bonding temperature is about 140° C. A temperature in the mounting process using SnPb solder in a reflow furnace is about 220° C. higher than the eutectic temperature of 183° C. Therefore, the In bonding layer is influenced by heat during the mounting process so that the reliability of bonding of the semiconductor chip lowers.

Since AuSn is used for the die-bonding, the bonding temperature can be set to 280° C. so that the above-described problem of the mounting process using SnPb can be solved. However, if solder such as SnAgCu requiring a higher temperature is used, the above-described problem still remains. The eutectic temperature of SnAgCu is 217° C., and this temperature rises to about 250° C. in a reflow mounting process, which is near the eutectic temperature of AuSn.

However, as described with reference to FIGS. 24A to 24D, by using AuSn as the eutectic material for the die-bonding process and Al as the material of the diffusion material layer, stable tight adhesion can be realized even at a temperature during the reflow mounting process higher than the melting point of AuSn.

In the manufacture method for an electronic component unit described with reference to FIGS. 24A to 24D, although the base lamination region 82 corresponding to the support substrate shown in FIG. 1B and the electronic component 84 corresponding to the semiconductor lamination structure 31 are formed, the base lamination region 82 and electronic component 84 may be formed to have the structures of other semiconductor light emitting devices having similar effects to those of the device shown in FIG. 8.

The present invention has been described in connection with the preferred embodiments. The invention is not limited only to the above embodiments. For example, although the semiconductor light emitting device manufactured by the method described with reference to FIGS. 1A to 1H has the semiconductor light emitting layer, other semiconductor layers having functions different from that of the semiconductor light emitting layer may also be formed. It will be apparent to those skilled in the art that other various modifications, improvements, combinations, and the like can be made.

The embodiment is preferably applicable to electronic components to be subjected to high temperature heating after a mounting process, particularly display light emitting diodes, infrared light emitting diodes and the like requiring a high luminance and a high light emission efficiency.

We claim:

1. A manufacture method for a semiconductor device comprising steps of:
   (a) preparing a first substrate;
   (b) forming a first bonding layer above said first substrate to form a support substrate;
   (c) preparing a second substrate;
   (d) forming a semiconductor layer on said second substrate;
   (e) forming a second bonding layer above said semiconductor layer to form a semiconductor lamination structure;
   (f) forming a diffusion material layer containing diffusion material by at least one of a step (f1) of forming said diffusion material layer above said first substrate and forming said first bonding layer above said diffusion material layer, respectively at said step (b) and a step (f2) of forming said diffusion material layer above said semiconductor material layer and forming said second bonding layer above said diffusion material layer, respectively at said step (e); and
   (g) bonding said first bonding layer of said support substrate and said second bonding layer of said semiconductor lamination structure to form a bonding body, said step (g) including a step (g1) of forming a first mixture body by mixing said first and second bonding layers, said first or second bonding layer containing eutectic material and a step (g2) of forming a second mixture body by mixing said first mixture body and the diffusion material of said diffusion material layer, said second mixture body having a melting point higher than a melting point of said first mixture body.

2. The manufacture method for a semiconductor device according to claim 1, wherein:

said step (f) forms a diffusion control layer on at least one of said diffusion material layers and forms said first or second bonding layer on said diffusion control layer; and said diffusion control layer is broken in said step (g).

3. The manufacture method for a semiconductor device according to claim 1, wherein:

said step (b) forms at least one of a tight adhesion improving layer and a set layer above said first substrate and forms said first bonding layer above at least one of said tight adhesion improving layer and said wet layer; and said step (f1) forms said diffusion material layer above said tight adhesion improving layer or said wet layer.

4. The manufacture method for a semiconductor device according to claim 1, wherein:

said step (e) forms at least one of a tight adhesion improving layer and a set layer above said semiconductor layer and forms said second bonding layer above at least one of said tight adhesion improving layer and said wet layer; and said step (f2) forms said diffusion material layer above said tight adhesion improving layer or said wet layer.

5. The manufacture method for a semiconductor device according to claim 1, wherein:

said step (d) further forms a first electrode at least in a partial surface area of said semiconductor layer and forms a barrier layer above said first electrode;

said step (e) forms said second bonding layer above said barrier layer;

said step (f2) forms said diffusion material layer between said barrier layer and said second bonding layer; and said barrier layer prevents eutectic material contained in said first or second bonding layer from invading toward said first electrode in said step (g).

6. The manufacture method for a semiconductor device according to claim 1, wherein:

said first or second bonding layer is made of eutectic material containing mainly Au.

7. The manufacture method for a semiconductor device according to claim 1, wherein:

said step (f) forms said diffusion material layer by using alloy containing mainly Al, Ag or Cu, or Al, Ag or Cu.

* * * * *